US012615785B2

(12) United States Patent
Cui et al.

(10) Patent No.: US 12,615,785 B2
(45) Date of Patent: Apr. 28, 2026

(54) SEMICONDUCTOR STRUCTURE HAVING BIT LINE SUPPORT STRUCTURE AND MANUFACTURING METHOD THEREOF

(71) Applicant: CHANGXIN MEMORY TECHNOLOGIES, INC., Hefei City (CN)

(72) Inventors: Zhaopei Cui, Hefei (CN); Ying Song, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 610 days.

(21) Appl. No.: 18/150,310

(22) Filed: Jan. 5, 2023

(65) Prior Publication Data

US 2023/0371287 A1      Nov. 16, 2023

Related U.S. Application Data

(63) Continuation of application No. PCT/CN2022/096232, filed on May 31, 2022.

(30) Foreign Application Priority Data

May 16, 2022    (CN) .......................... 202210527175.2

(51) Int. Cl.
H01L 21/768        (2006.01)
H01L 23/532        (2006.01)
(Continued)

(52) U.S. Cl.
CPC .......... H10B 99/00 (2023.02); H10W 20/081 (2026.01); H10W 20/47 (2026.01)

(58) Field of Classification Search
CPC ... H10B 12/00; H10B 12/01; H01L 21/76802; H01L 27/76837
See application file for complete search history.

(56) References Cited

U.S. PATENT DOCUMENTS 8,198,189 B2      6/2012   Kim
2010/0285662 A1    11/2010   Kim
(Continued)

FOREIGN PATENT DOCUMENTS

CN          103681677 B        7/2018
CN          104103578 B        7/2018
(Continued)

*Primary Examiner* — Davienne N Monbleau
*Assistant Examiner* — Emily Farmer
(74) *Attorney, Agent, or Firm* — Syncoda LLC; Feng Ma

(57) ABSTRACT

A semiconductor structure and a manufacturing method thereof are provided. The semiconductor structure includes a substrate, bit line structures distributed at intervals, initial support pattern structures distributed at intervals and target conductive contact structures. The bit line structures distributed at intervals are located on the substrate, and the bit line structures extend along a first direction. Each of the initial support pattern structures runs through top regions of the bit line structures, the initial support pattern structures extend along a second direction, and the first direction intersects with the second direction. Each of the target conductive contact structures is located within adjacent bit line structures and adjacent initial support pattern structures, and each of the target conductive contact structures includes a conductive plug structure and a target protective layer covering an outer sidewall of the conductive plug structure.

11 Claims, 23 Drawing Sheets

(51) Int. Cl.

| | | |
|---|---|---|
| *H10B 99/00* | (2023.01) | |
| *H10W 20/00* | (2026.01) | |
| *H10W 20/47* | (2026.01) | |

(56) References Cited

U.S. PATENT DOCUMENTS

| | | | |
|---|---|---|---|
| 2012/0217631 A1 | 8/2012 | Kim | |
| 2015/0171163 A1 | 6/2015 | Lee et al. | |
| 2020/0273862 A1* | 8/2020 | Wu ................... | H10B 12/0335 |
| 2021/0296350 A1 | 9/2021 | Jin | |
| 2022/0013526 A1 | 1/2022 | Kwon | |
| 2022/0077159 A1 | 3/2022 | Li | |
| 2022/0085032 A1 | 3/2022 | Ping et al. | |
| 2022/0122976 A1 | 4/2022 | Kim | |
| 2022/0319915 A1 | 10/2022 | Cui et al. | |

FOREIGN PATENT DOCUMENTS

| | | | | |
|---|---|---|---|---|
| CN | 111524887 A | 8/2020 | | |
| CN | 111710642 A | 9/2020 | | |
| CN | 112885782 A | 6/2021 | | |
| CN | 113097148 A | 7/2021 | | |
| CN | 113921499 A | 1/2022 | | |
| CN | 114373735 A | 4/2022 | | |
| CN | 115148676 A | 10/2022 | | |
| KR | 20100097989 A | * | 9/2010 | ........... H10B 12/485 |

* cited by examiner

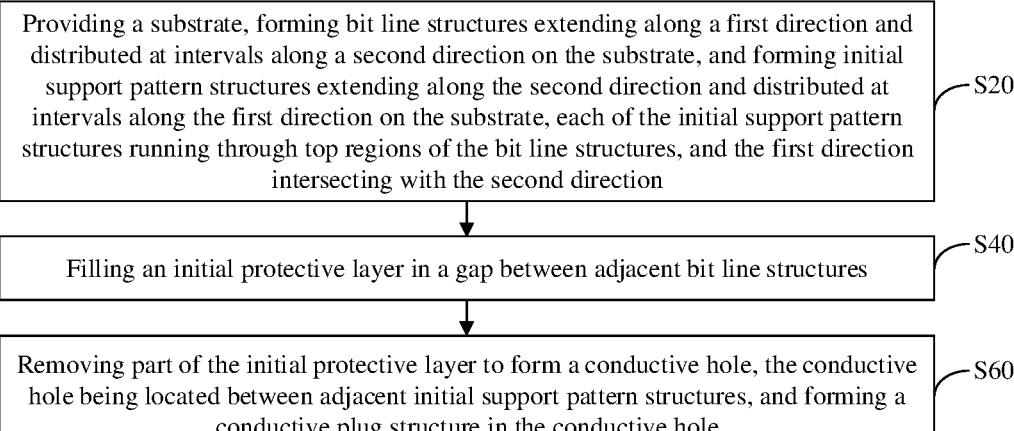

| Providing a substrate, forming bit line structures extending along a first direction and distributed at intervals along a second direction on the substrate, and forming initial support pattern structures extending along the second direction and distributed at intervals along the first direction on the substrate, each of the initial support pattern structures running through top regions of the bit line structures, and the first direction intersecting with the second direction | S20 |
| --- | --- |
| Filling an initial protective layer in a gap between adjacent bit line structures | S40 |
| Removing part of the initial protective layer to form a conductive hole, the conductive hole being located between adjacent initial support pattern structures, and forming a conductive plug structure in the conductive hole | S60 |

FIG. 1

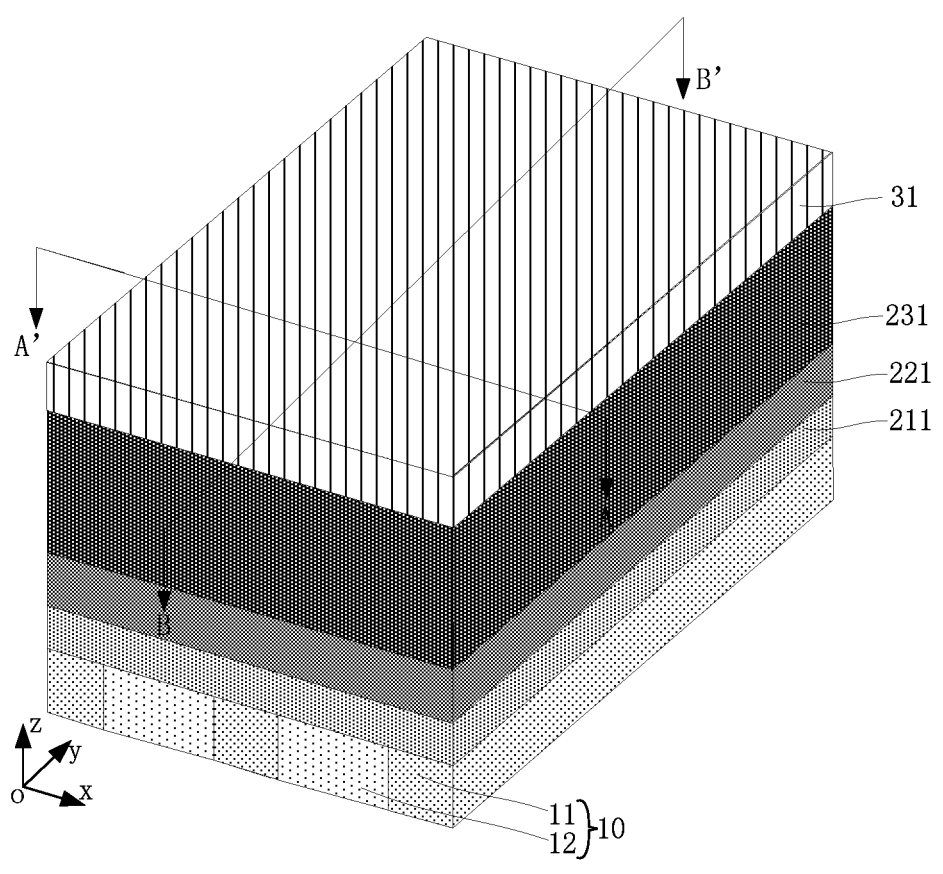

SEMICONDUCTOR STRUCTURE HAVING BIT LINE SUPPORT STRUCTURE AND MANUFACTURING METHOD THEREOF

CROSS-REFERENCE TO RELATED APPLICATIONS

This is a continuation application of International Patent Application No. PCT/CN2022/096232, filed on May 31, 2022, which claims priority to Chinese Patent Application No. 202210527175.2, filed on May 16, 2022 and entitled "SEMICONDUCTOR STRUCTURE AND MANUFAC-TURING METHOD THEREOF". The contents of International Patent Application No. PCT/CN2022/096232 and Chinese Patent Application No. 202210527175.2 are incorporated by reference in their entireties.

BACKGROUND

With the rapid development of integrated circuit process, semiconductor devices are developing in the direction of high speed, high integration density and low power consumption. According to Moore's Law, with the size of semiconductor device structure becoming more and more miniature, especially in the manufacturing process of semi-conductor devices with extremely small line width, the main reason that limits the running speed of semiconductor devices has been changed from the transistor delay to the resistance and capacitance delay caused by interconnection of conductive materials. Therefore, how to reduce the para-sitic capacitance caused by the interconnection of conduc-tive materials has become one of the key factors to further improve the performance and reliability of semiconductor devices.

In addition, in the manufacturing process of traditional semiconductor memory device, the critical dimension of the bit line is very small, and the height of the bit line is relatively high, which lead to the relatively fragile bit line structure of the manufactured semiconductor device struc-ture. During the formation of the bit line structure, distor-tion, tilt or collapse often occur, which not only affects the electrical performance parameters of the bit line and the quality of signal transmission, but also may lead to the failure to activate the capacitance contact structure. There-fore, if the capacitance contact structure with high quality and low resistance can be manufactured, the performance and reliability of the memory will be greatly improved.

SUMMARY

The present disclosure relates to the field of semiconduc-tor manufacturing technical, in particular to a semiconductor structure and a manufacturing method thereof.

According to an aspect of the present disclosure, there is provided a semiconductor structure. The semiconductor structure includes a substrate, bit line structures distributed at intervals, initial support pattern structures distributed at intervals and target conductive contact structures. The bit line structures distributed at intervals are located on the substrate, and the bit line structures extend along a first direction. Each of the initial support pattern structures runs through top regions of the bit line structures, the initial support pattern structures extend along a second direction, and the first direction intersects with the second direction. Each of the target conductive contact structures is located within adjacent bit line structures and adjacent initial sup-port pattern structures; each of the target conductive contact structures includes a conductive plug structure and a target protective layer covering an outer sidewall of the conductive plug structure.

According to another aspect of the present disclosure, there is provided a method for manufacturing a semicon-ductor structure. The method includes that: a substrate is provided; bit line structures extending along a first direction are formed on the substrate; and initial support pattern structures extending along the second direction are formed on the substrate, each of the initial support pattern structures running through top regions of the bit line structures, and the first direction intersecting with the second direction; an initial protective layer is filled in a gap between adjacent bit line structures; and part of the initial protective layer is removed to form a conductive hole, the conductive hole being located between adjacent initial support pattern struc-tures, and a conductive plug structure is formed in the conductive hole.

Details of one or more embodiments of the present disclosure are set forth in the following accompanying drawings and description. Other features, objects and advan-tages of the present disclosure will become apparent from the description, accompanying drawings and claims.

BRIEF DESCRIPTION OF THE DRAWINGS

In order to explain more clearly technical solutions of the embodiments of the disclosure, accompanying drawings required in the description of the embodiments will be introduced simply below. Obviously, the drawings in the below description are only used for some embodiments of the disclosure, and other drawings may be acquired based on these drawings by those skilled in the art without creative efforts.

FIG. 1 illustrates a flowchart of a method for manufac-turing a semiconductor structure provided in an embodiment of the present disclosure.

FIG. 2A-FIG. 6C illustrate three-dimensional diagrams and cross-sectional structural diagrams of the structure obtained at S20 of a method for manufacturing a semicon-ductor structure provided in an embodiment of the present disclosure.

FIG. 7A-FIG. 7C illustrate three-dimensional diagrams and cross-sectional structural diagrams of the structure obtained by the operation of forming a bit line protective layer of a method for manufacturing a semiconductor structure provided in an embodiment of the present disclosure. FIG. 7B illustrates a cross-sectional diagram of the three-dimensional diagram structure illustrated in FIG. 7A along the AA' direction; FIG. 7C illustrates a cross-sectional diagram of the three-dimensional diagram structure illustrated in FIG. 7A along the BB' direction.

FIG. 8B illustrates a cross-sectional diagram of the three-dimensional diagram structure illustrated in FIG. 8A along the AA' direction; FIG. 8C illustrates a cross-sectional diagram of the three-dimensional diagram structure illustrated in FIG. 8A along the BB' direction.

FIG. 9A-FIG. 13E illustrate three-dimensional diagrams and cross-sectional structural diagrams of the structure obtained at S60 of a method for manufacturing a semiconductor structure provided in an embodiment of the present disclosure.

FIG. 13E13E illustrates a cross-sectional diagram of the three-dimensional diagram structure illustrated in FIG. 13A along the DD' direction.

DETAILED DESCRIPTION

Figure 2B:
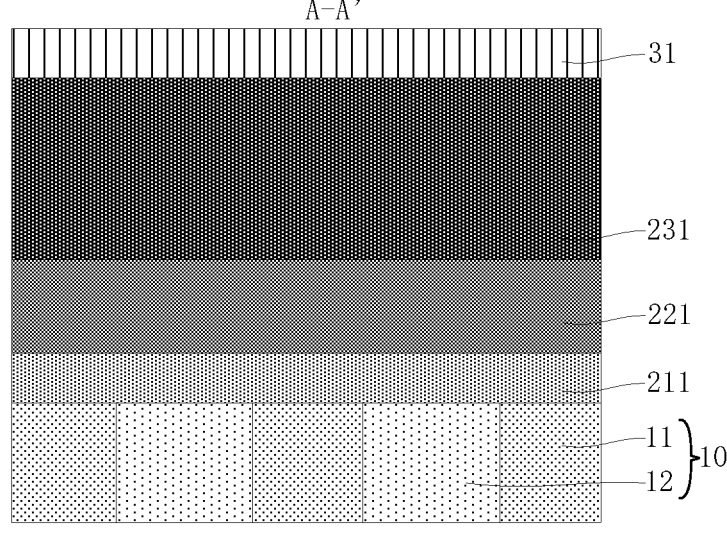
FIG. 2B illustrates a cross-sectional diagram of the three-dimensional diagram structure illustrated in FIG. 2A along the AA' direction.

For ease of understanding the present disclosure, a more complete description will be given below with reference to the related drawings. Preferred embodiments of the present disclosure are given in the accompanying drawings. However, the present disclosure may be implemented in many different forms and is not limited to the embodiments described herein. Rather, these embodiments are provided with a view to making the disclosure of the present disclosure more thorough and comprehensive.

Unless otherwise defined, all technical and scientific terms used herein have the same meanings as are commonly understood by those skilled in the art of the present disclosure. Terms used in the description of the present disclosure are for the purpose of describing specific embodiments only and are not intended to limit the present disclosure. The term "and/or" as used herein includes any and all combinations of one or more related listed items.

It should be understood that when an element or layer is referred to as "on", "adjacent to", "connected to" or "coupled to" another element or layer, it may be directly on, adjacent to, connected to, or coupled to the other element or layer, or may exist intervening elements or layers. In contrast, when an element is referred to as being "directly on", "directly adjacent to", "directly connected to" or "directly coupled to" other element or layer, there are no intervening elements or layers present. It should be understood that while the terms first, second, third, etc. may be used to describe various elements, components, regions, layers, and/or portions, such elements, components, regions, layers, and/or portions should not be limited by such terms. These terms are used only to distinguish one element, component, region, layer, or portion from another element, component, region, layer, or portion. Thus, the first element, component, region, layer, or portion discussed below may be represented as a second element, component, region, layer, or portion without departing from the teachings of the present disclosure.

Spatial relation terms such as "under", "below", "at the bottom of", "lower", "above", "on", etc. may be used herein for convenience of description to describe the relationship of one element or feature illustrated in the figure to other elements or features. It should be understood that the spatial relationship term is intended to include different orientations of devices in use and operation in addition to the orientations illustrated in the figure. For example, if the device in the drawings is flipped, then the element or feature described as "under the other element" or "below the other element" or "at the bottom of the other element" will be oriented "over" the other element or feature. Thus, the exemplary terms "below" and "under" may include both over and under orientations. The device may be additionally oriented (rotated 90 degrees or other orientation) and the spatial descriptors used herein are interpreted accordingly.

The term used herein is intended to describe specific embodiments only and is not to be a limitation of the present disclosure. As used herein, the singular forms of "a", "an" and "said/the" are also intended to include the plural, unless the context clearly indicates otherwise. It should also be understood that the terms "composed of" and/or "including", when used in this description, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

Embodiments of the present disclosure are described herein with reference to cross-sectional diagrams which are schematic diagrams of ideal embodiments (and intermediate structures) of the present disclosure. In this way, changes from the illustrated shape due to, for example, manufacturing techniques and/or tolerances can be anticipated. Thus, embodiments of the present disclosure should not be limited to the specific shape of the regions illustrated herein, but include shape deviations due to, for example, manufacturing, the regions illustrated in the figure are essentially schematic, and their shapes are not intended to display the actual shape of the regions of the device and are not intended to limit the scope of the present disclosure.

See FIG. 1-FIG. 13E, it should be noted that the diagrams provided in the embodiments are only used to illustrate the basic concept of the present disclosure in a schematic way, although the diagrams only show the components related to the present disclosure and are not drawn according to the number, shape, scale and size of the components in actual implementation, the type, quantity and proportion of each component can be arbitrarily changed in actual implementation, and the layout type of components may also be more complicated.

Referring to FIG. 1, in an embodiment of the present disclosure, there is provided a method for manufacturing a semiconductor structure, the method includes the following operations at S20-S60.

At S20, a substrate is provided, bit line structures extending along a first direction are formed on the substrate, and initial support pattern structures extending along the second direction are formed on the substrate, each of the initial support pattern structures running through top regions of the bit line structures, and the first direction intersecting with the second direction.

At S40, an initial protective layer is filled in a gap between adjacent bit line structures.

At S60, part of the initial protective layer is removed to form a conductive hole, the conductive hole being located between adjacent initial support pattern structures; and a conductive plug structure is formed in the conductive hole.

Specifically, please continue to refer to FIG. 1, before manufacturing the bit line structures distributed at intervals, initial support pattern structures running through the bit line structures are formed at the top region of the obtained structure, so as to provide a support force for the bit line structures, improve the structural strength of the bit line structures, and avoid distortion, tilt or collapse of the bit line structures in the formation process. Due to the existence of the support of the initial support pattern structures, the depth-to-width ratio of the manufactured bit line structures and the capacitance contact structures can be further improved, the electrical performance parameters and the signal transmission quality of the manufactured bit line can be improved, and the situation that the target conductive contact structures cannot be activated can be effectively avoided. Because there is a target protective layer between the manufactured conductive plug structure for capacitance contact and the bit line structures, the parasitic capacitance between the bit line structures and the capacitance contact structure can be effectively reduced.

At S20, referring to FIG. 2A, a substrate 10 is provided, a plurality of trench isolation structures 11 isolated from each other may be formed in the substrate 10, and an active region structure 12 is defined between adjacent trench isolation structures 11. The substrate 10 may be composed of a semiconductor material, an insulating material, a conductor material or any combination thereof. The substrate 10 may have a single-layer structure or a multi-layer structure. For example, the substrate 10 may be such as a silicon (Si) substrate, a silicon germanium (SiGe) substrate, a silicon germanium carbon (SiGeC) substrate, a silicon carbide (SiC) substrate, a gallium arsenide (GaAs) substrate, indium arsenide (InAs) substrate, indium phosphide (InP) substrate, or other III/V semiconductor substrate or II/VI semiconductor substrate. Alternatively, for example, the substrate 10 may be a layered substrate including such as Si/SiGe, Si/SiC, silicon on insulator (SOI) or silicon germanium on insulator. Therefore, the type of the substrate 10 should not limit the scope of protection of the present disclosure. The substrate 10 may include a word line structure, a capacitance contact structure and the like, which are omitted since they have little to do with the inventive point of the present disclosure.

At S20, please continue to refer to S20 in FIG. 1 and FIG. 2A-FIG. 6C, the operations that the bit line structures and the initial support pattern structures are formed include operations at S22-S28.

At S22, a first conductive material layer (not illustrated), a barrier material layer 211, a second conductive material layer 221 and a first dielectric material layer 231 are sequentially stacked on the substrate 10.

At S24, the initial support pattern structures 302 are formed on the first dielectric material layer 231, a first groove 301 being provided between adjacent initial support pattern structures 302.

At S26, second dielectric layers 303 are formed, each of the second dielectric layers 303 filling at least the first groove 301.

At S28, part of the second dielectric layers 303, part of the first dielectric material layer 231, part of the second conductive material layer 221, part of the barrier material layer 211 and part of the first conductive material layer are removed to form the bit line structures 20, initial support pattern structures 302 located between adjacent bit line structures 20 being suspended in midair.

Figure 2C:
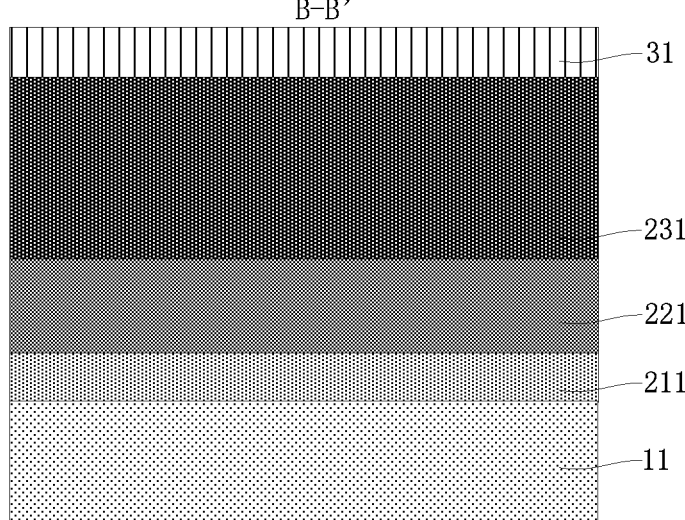
FIG. 2C illustrates a cross-sectional diagram of the three-dimensional diagram structure illus-trated in FIG. 2A along the BB' direction.

As an example, please continue to refer to S22 and FIG. 2A-FIG. 2C, a first conductive material layer (not illustrated), a barrier material layer 211, a second conductive material layer 221 and a first dielectric material layer 231 are sequentially stacked on the substrate 10 to manufacture the bit line structures. The first conductive material layer, the barrier material layer 211, the second conductive material layer 221 and the first dielectric material layer 231 may be formed by but not limited to a deposition process, Then, an initial support material layer 31 is formed on the upper surface of the first dielectric material layer 231. The initial support material layer 31 may be formed on the first dielectric material layer 231 by a deposition process, and then the upper surface of the initial support material layer 31 is planarized by a planarization process or an etching process. The first conductive material layer may include but is not limited to a polysilicon layer, the barrier material layer 211 may include but is not limited to a titanium nitride layer, and the second conductive material layer 221 may include but is not limited to a tungsten layer, a tantalum (Ta) metal layer, a stack of Ta and tantalum titanium (TaTi), a tungsten nitride (WN) material layer or a cobalt silicide (CoSi) material layer, etc. The first dielectric material layer 231 may include but is not limited to a silicon nitride layer. The deposition process may be one or more of chemical vapor deposition (CVD), atomic layer deposition (ALD), high density plasma (HDP) and plasma enhanced deposition.

Figure 3A:
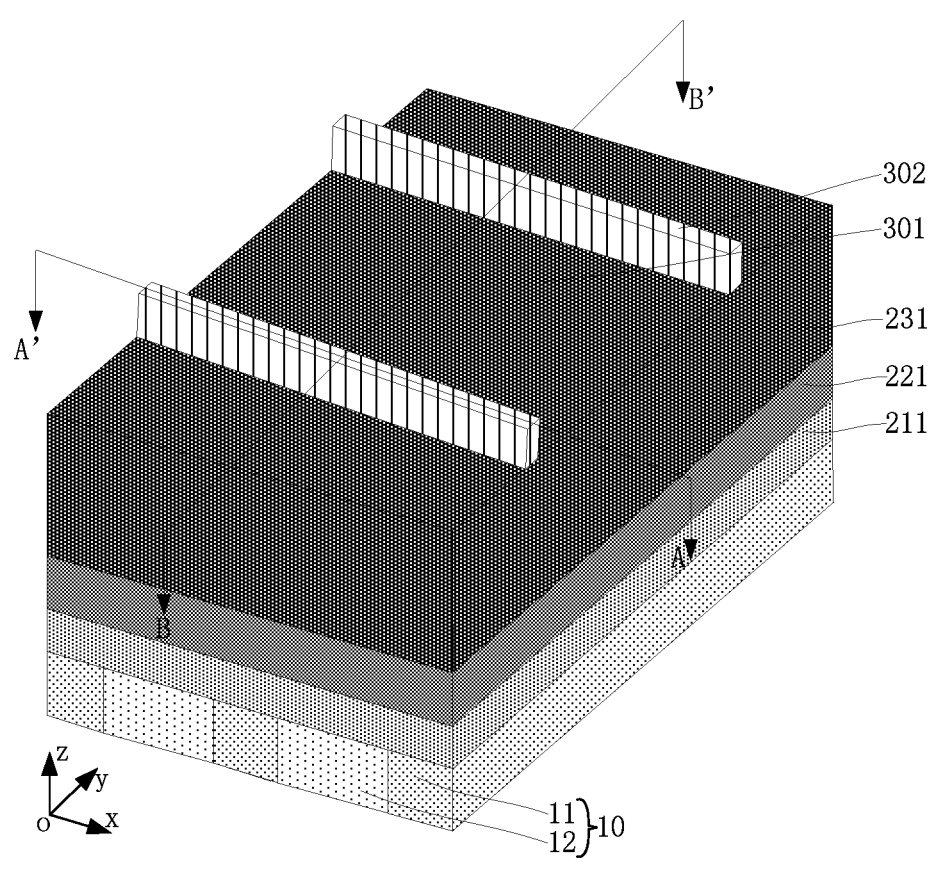
Figure 3B:
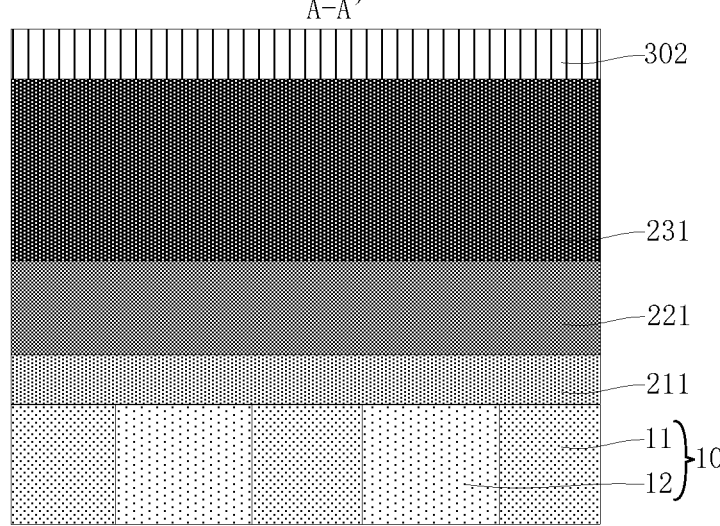
FIG. 3B illustrates a cross-sectional diagram of the three-dimensional diagram structure illustrated in FIG. 3A along the AA' direction.
Figure 3C:
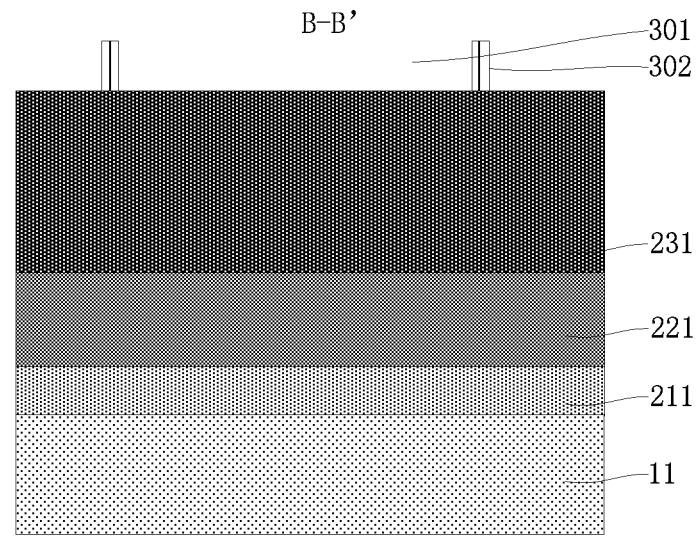
FIG. 3C illustrates a cross-sectional diagram of the three-dimensional diagram structure illus-trated in FIG. 3A along the BB' direction.

As an example, referring to S24 and FIG. 3A-FIG. 3C, in the operation that the initial support pattern structures 302 are formed on the first dielectric material layer 231, the initial support material layer is formed on the first dielectric material layer 231 by a deposition process, and then the upper surface of the initial support material layer is planarized by a planarization process or an etching process. Then, the first dielectric material layer 231 is taken as an etching stop layer, part of the initial support material layer is etched by a dry etching process to form the initial support pattern structures 302, and a first groove 301 is provided between adjacent initial support pattern structures 302. The planarization process may include, but is not limited to, a chemical mechanical grinding process.

As an example, a material forming the first dielectric material layer may include silicon nitride. In the process of etching the initial support material layer by the dry etching process, if the light emission spectrum of the first dielectric material layer is detected, the etching is stopped. The etching gas may include octafluorocyclobutane ($C_4F_8$) and oxygen ($O_2$).

As an example, please continue to refer to FIG. 2A-FIG. 3C, the following etching conditions may be set during the process of forming the initial support pattern structures 302.

An etching selectivity ratio of the initial support material layer 31 to the first dielectric material layer 231 is greater than 10:1 under a same condition. The embodiment avoids the situation where the bottom height of the first groove 301 are different between adjacent initial support pattern structures 302 in the process of taking the first dielectric material layer 231 as an etching stop layer, etching part of the initial support material layer by a dry etching process and forming the initial support pattern structures 302, and the morphology and structural strength of the manufactured initial support pattern structure 302 are effectively improved. The dry etching includes at least any one of reactive ion etching (RIE), inductively coupled plasma (ICP) etching or high density plasma (HDP) etching.

As an example, please continue to refer to FIG. 2A-FIG. 3C, a material forming the initial support material layer 31 include, but are not limited to, silicon carbide nitride (SiCN), a material forming the first dielectric material layer 231 includes silicon nitride (SIN), so as to form the initial support pattern structures 302 for supporting the bit line structure before the bit line structure is manufactured by an etching process, so that the initial support pattern structures 302 provide a supporting force for the bit line structures, the structural strength of the bit line structures is improved, and distortion, tilt, collapse and the like in the process of forming the bit line structures are avoided.

As an example, please continue to refer to FIG. 2A-FIG. 3C, a width of an initial support pattern structure 302 ranges from one half of a width of a bit line structure to the width of the bit line structure. For example, the width of the initial support pattern structure 302 may be 0.5, 0.75, 0.9, or 1 times of the width of the bit line structure 20 or the like. The width of the initial support pattern structure 302 is narrower, which ensures that the first dielectric material layer 231, the second conductive material layer 221, the barrier material layer 211, and the first conductive material layer below the initial support pattern structures 302 can be easily removed by adjusting the parameters of the etching process.

Figure 4A:
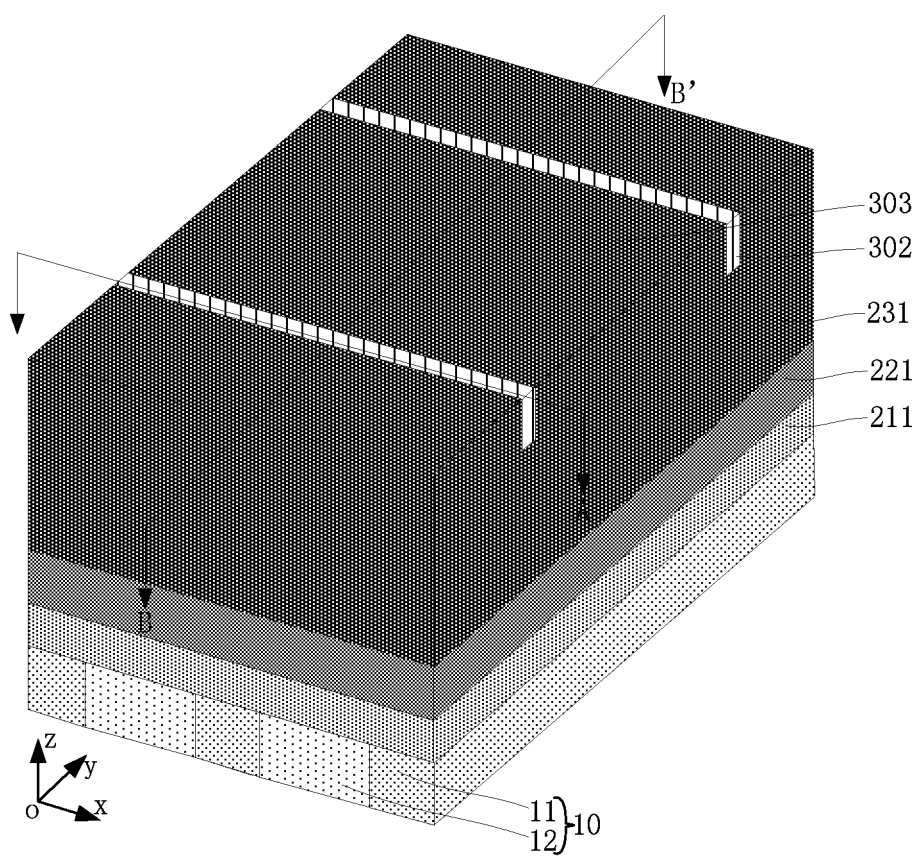
Figure 4B:
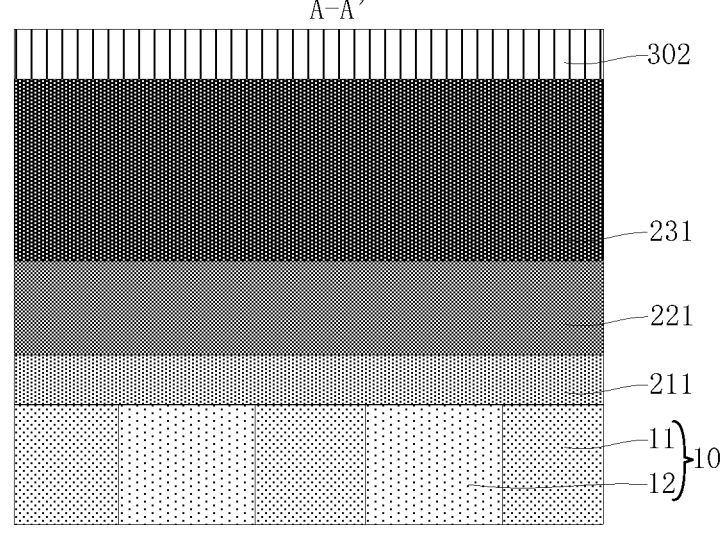
FIG. 4B illustrates a cross-sectional diagram of the three-dimensional diagram structure illustrated in FIG. 4A along the AA' direction.
Figure 4C:
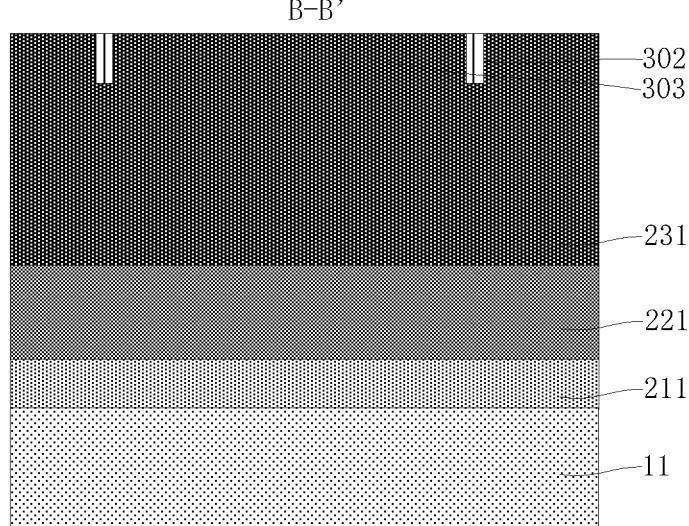
FIG. 4C illustrates a cross-sectional diagram of the three-dimensional diagram structure illus-trated in FIG. 4A along the BB' direction.

As an example, referring to S26 and FIG. 4A-FIG. 4C, a deposition process may be employed to form second dielectric layers 303, and each of the second dielectric layers 303 fills at least the first groove 301, so that the upper surface of the obtained structure is flush. The second dielectric layers 303 may be formed within first grooves 301 by using one or more of atomic layer deposition, chemical vapor deposition, spin coating the insulating medium, or the like, so that the upper surface of the obtained structure is flush, to avoid the large size difference of the bit line structures obtained by subsequent etching, and avoid the distortion, tilt or collapse in the process of forming the bit line structures, so as to improve the strength and homogeneity of the bit line structures.

As an example, referring to FIG. 5A-FIG. 6C, the operation that the bit line structures are formed at S28 further includes operations at S282-S284.

At S282, a first patterned photoresist layer 50 is formed on upper surfaces of the second dielectric layers 303, first openings 501 being provided in the first patterned photoresist layer 50, and the first openings 501 being used for defining shape and position of the bit line structures.

At S284, the part of the second dielectric layers 303, the part of the first dielectric material layer 231, the part of the second conductive material layer 221, the part of the barrier material layer 211 and the part of the first conductive material layer (not illustrated) are etched by using the first patterned photoresist layer 50 as a mask, to form the bit line structures 20 and the gaps between the adjacent bit line structures 20, such that initial support pattern structures 302 located between the adjacent bit line structures 20 are suspended in midair.

Figure 5A:
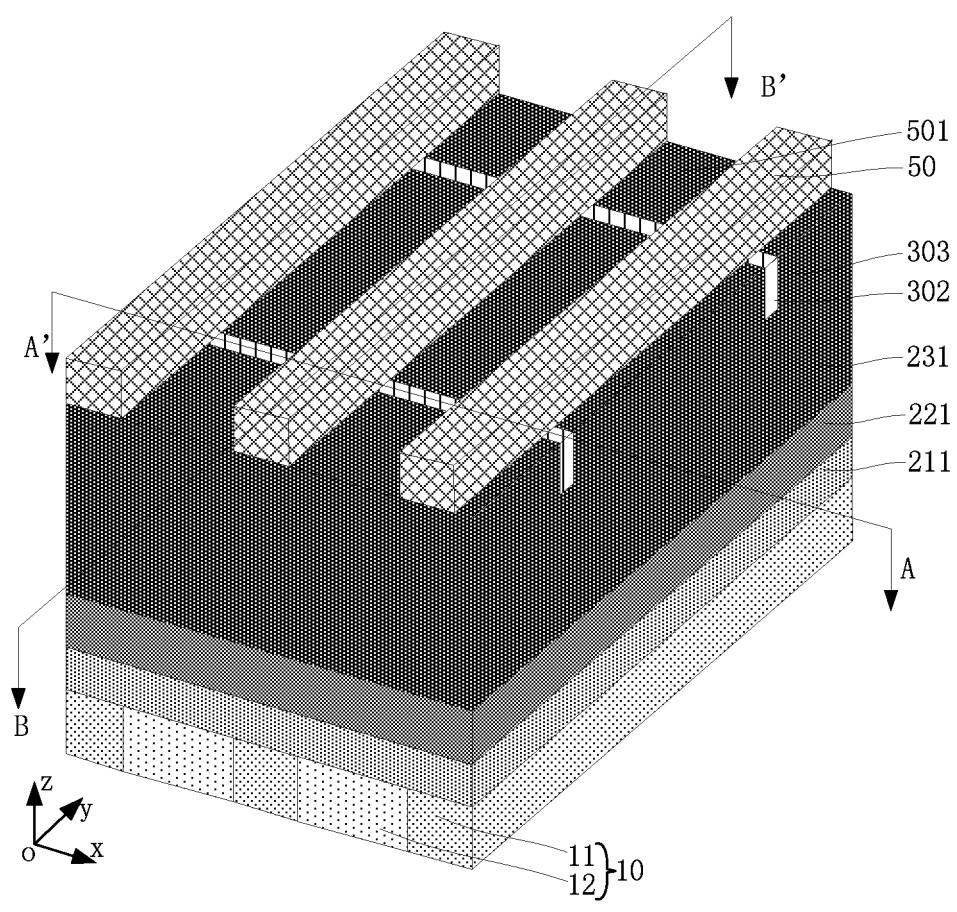
Figure 5B:
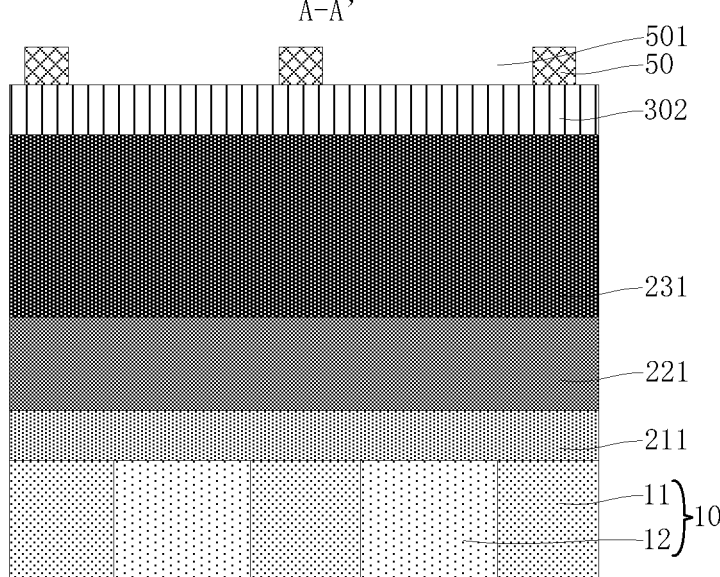
FIG. 5B illustrates a cross-sectional diagram of the three-dimensional diagram structure illustrated in FIG. 5A along the AA' direction.
Figure 5C:
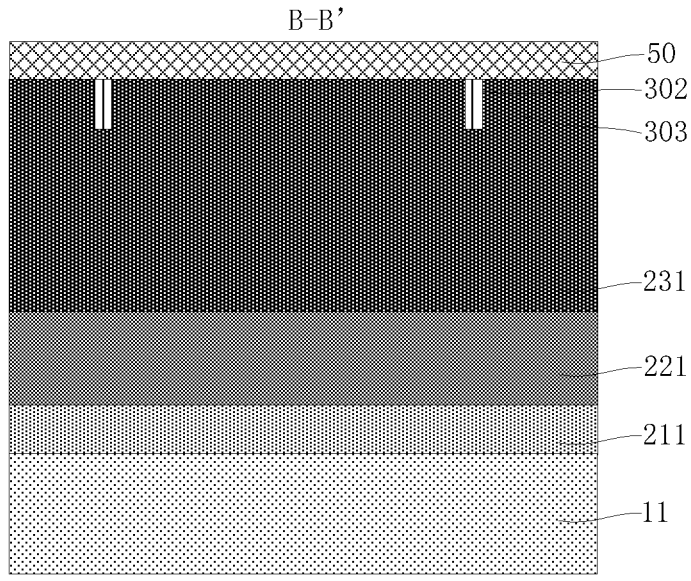
FIG. 5C illustrates a cross-sectional diagram of the three-dimensional diagram structure illus-trated in FIG. 5A along the BB' direction.
Figure 6A:
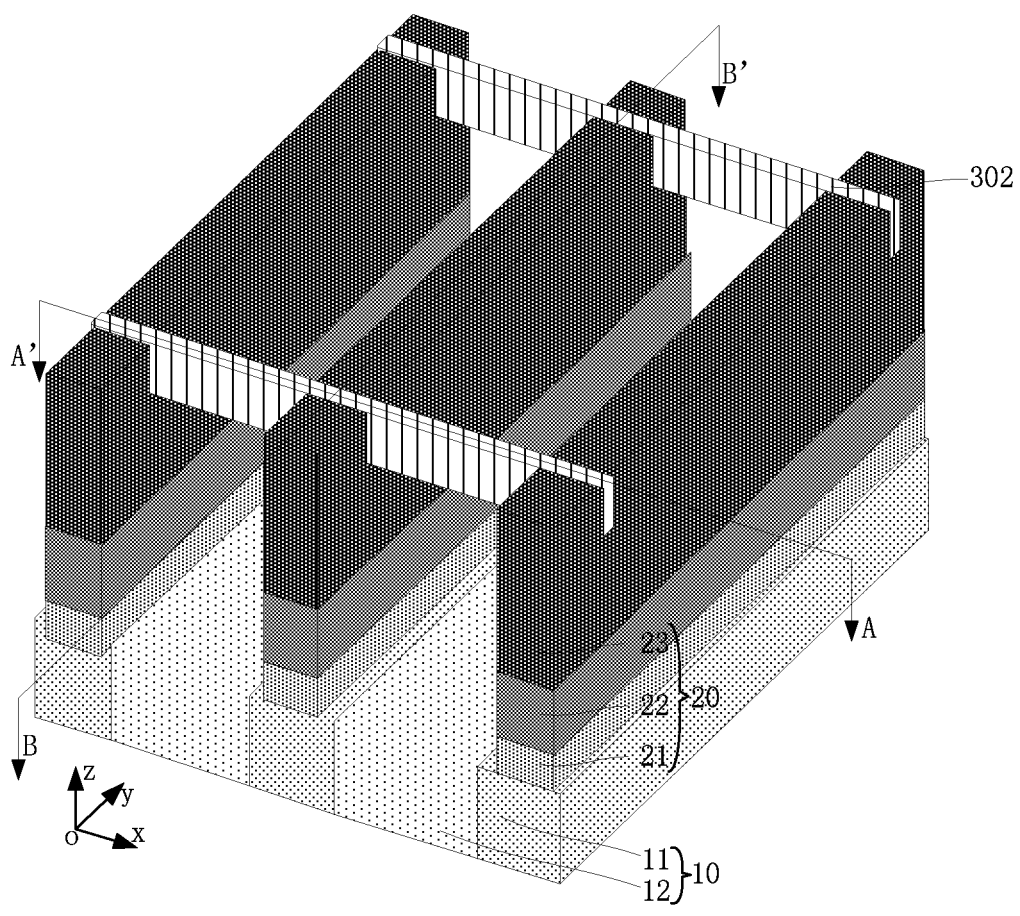
Figure 6B:
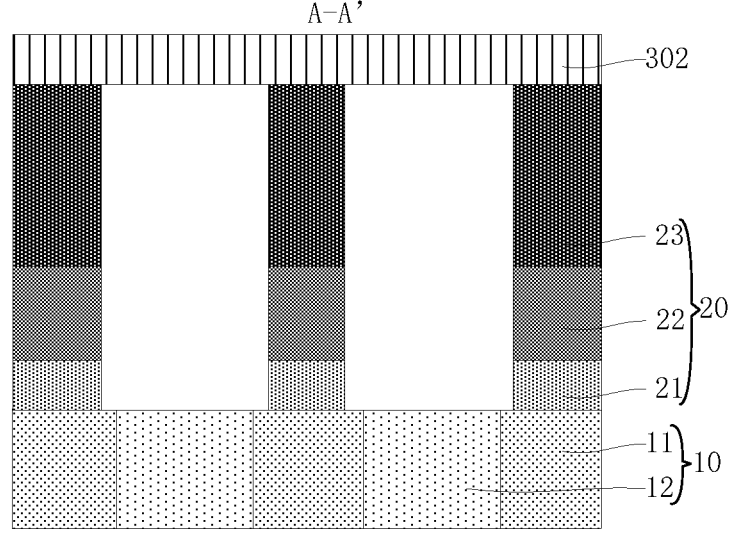
FIG. 6B illustrates a cross-sectional diagram of the three-dimensional diagram structure illustrated in FIG. 6A along the AA' direction.
Figure 6C:
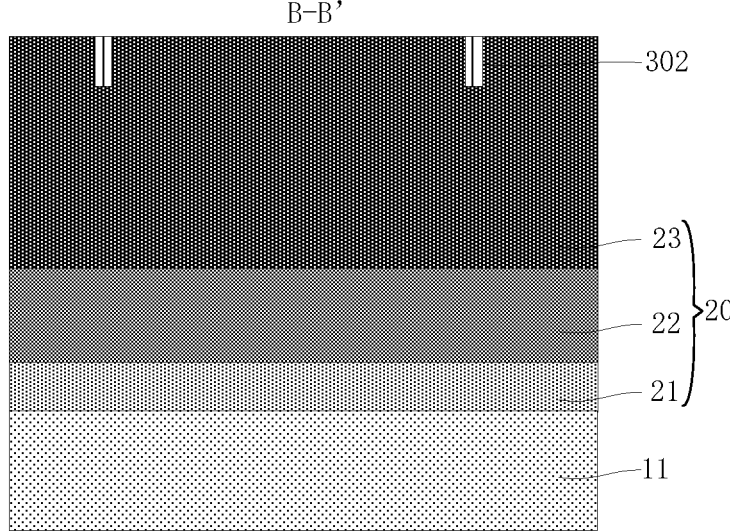

As an example, referring to 5282 and FIG. 5A-FIG. 5C, after the photoresist layer (not illustrated) is coated on the upper surface of the second dielectric layer 303, the first patterned photoresist layer 50 may be formed on the upper surfaces of the second dielectric layers 303 through a series of steps such as exposure and development. The first patterned photoresist layer 50 includes but is not limited to N-photoresist layer. First openings 501 are provided in the first patterned photoresist layer 50, and the first openings 501 are used for defining the shape and position of the bit line structures to form a high depth-to-width ratio bit line structures trench after further pattern transfer.

As an example, referring to S282 and FIG. 5A-FIG. 5C, the first openings 501 extend along a first direction (e.g. oy direction) to define the shape and position of the bit line structures. The first direction and the second direction have an included angle greater than 0° and less than or equal to 90°. For example, the included angle is 1°, 2°, 10°, 30°, 50°, 70° or 90°, etc. Optionally, the first direction and the second direction are perpendicular to each other.

As an example, referring to S284 and FIG. 5A-FIG. 6C, the part of the second dielectric layers 303, the part of the first dielectric material layer 231, the part of the second conductive material layer 221, the part of the barrier material layer 211 and the part of the first conductive material layer (not illustrated) are removed by a dry etching process and by using the first patterned photoresist layer 50 as a mask, the remaining first dielectric material layer 231 constitutes the first dielectric layers 23, the remaining second conductive material layer 221 constitutes the second conductive layers 22, the remaining barrier material layer 211 constitutes the barrier layers 21, and the remaining first conductive material layer constitutes the first conductive layers (not illustrated), and the bit line structures 20 and the gaps between the adjacent bit line structures 20 are formed, such that initial support pattern structures 302 located between the adjacent bit line structures 20 are suspended in midair. A first conductive layer (not illustrated), a barrier layer 21, a second conductive layer 22, and a first dielectric layer 23 are stacked in order from bottom to top to form a bit line structure 20. The bit line structures 20 distributed at intervals extend along a first direction (e.g. oy direction). The initial support pattern structures 302 distributed at intervals extend along a second direction (e.g. ox direction). By way of example, the first direction and the second direction have an included angle greater than 0° and less than or equal to 90°. For example, the included angle is 1°, 2°, 10°, 30°, 50°, 70° or 90°, etc. Optionally, the first direction and the second direction are perpendicular to each other.

As an example, please continue to refer to S284 and FIG. 5A-FIG. 6C, the dry etching includes at least any one of reactive ion etching (RIE), inductively coupled plasma (ICP) etching or high density plasma (HDP) etching. Part of the second dielectric layers 303, part of the first dielectric material layer 231, part of the second conductive material layer 221, part of the barrier material layer 211 and part of the first conductive material layer which are below the initial support pattern structures 302 can be removed by adjusting the parameters of the etching process (e.g. gas flow, ratio of different gases, gas etching angle, plasma energy, etc.), thereby exposing the sidewalls of the bit line structure 20, facilitating subsequent formation of a bit line protective layer and improving the electrical performance and reliability of the manufactured bit line structure.

Figure 7A:
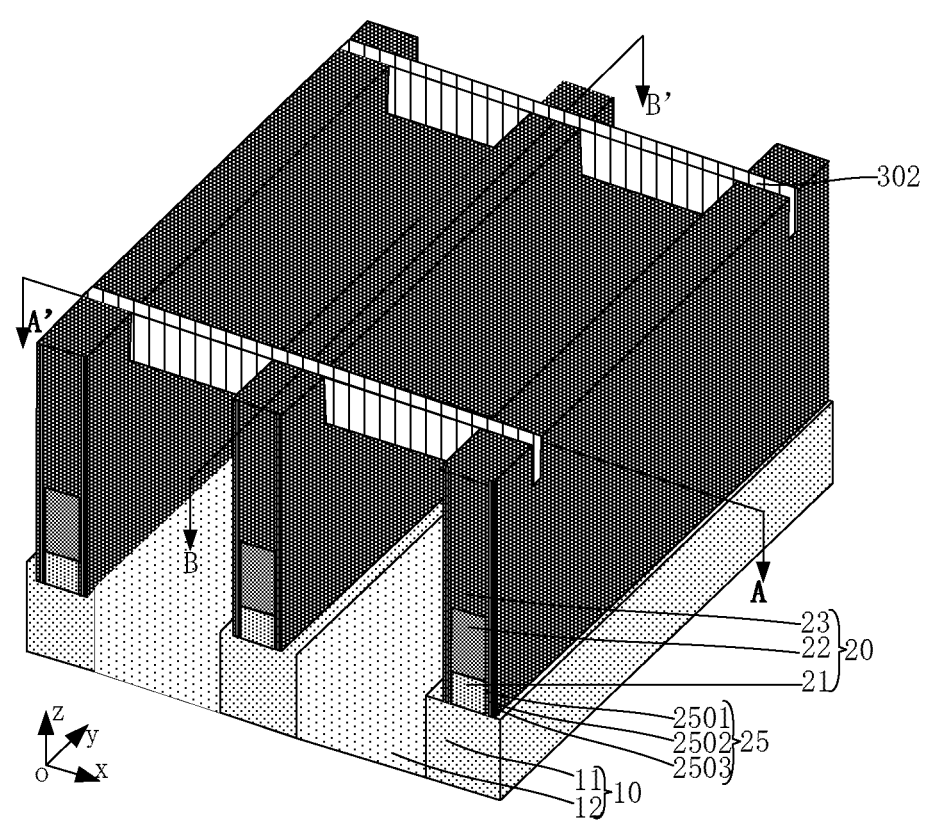
Figure 7B:
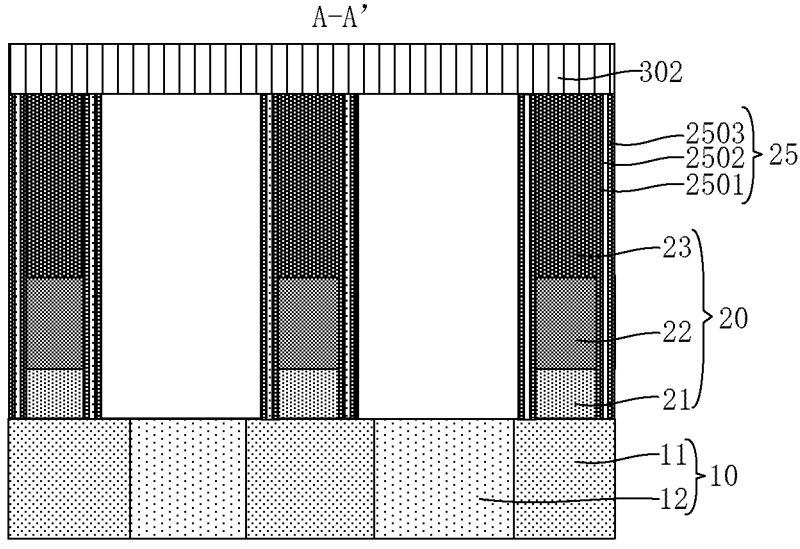
Figure 7C:
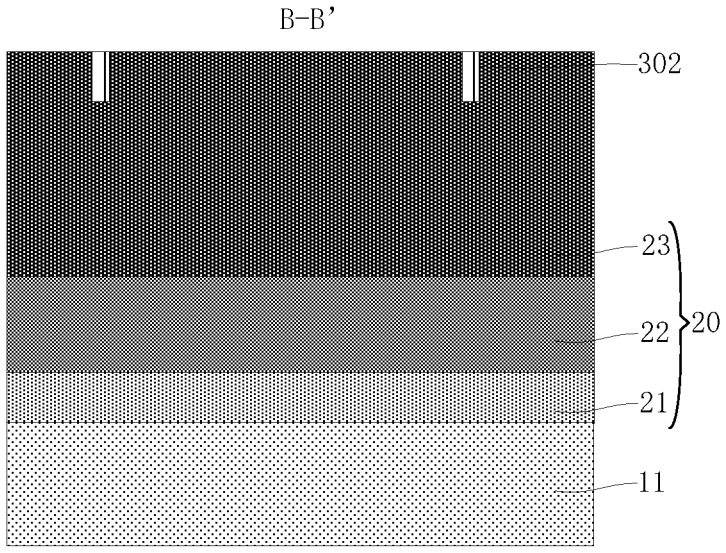
FIG. 7C illustrates a cross-sectional diagram of the three-dimensional diagram structure illus-trated in FIG. 6A along the BB' direction.

As an example, referring to FIG. 7A-FIG. 7C, before filling the initial protective layers 261 in the gaps formed at S282, the method further includes that: bit line protective layers 25 are formed on the outer sidewalls of the bit line structure 20. The bit line protective layer 25 includes a first bit line protective layer 2501, a second bit line protective layer 2502 and a third bit line protective layer 2503, which are stacked in sequence from inside to outside. The material of forming the first bit line protective layer 2501 and the material of forming the third bit line protective layer 2503 may be the same, for example, both of them are silicon nitride. The material forming the second bit line protective layer 2502 includes but is not limited to silicon oxide. In other embodiments, the material forming the first bit line protective layer 2501 and the material forming the third bit line protective layer 2503 may be different. In the embodiment, by forming the bit line protective layers 25 on the outer sidewalls of the bit line structure 20, electrical connection between the bit line structure 20 and the outer conductive structure is avoided, parasitic capacitance of the bit line structures 20 is reduced, and stability of the bit line structures 20 is improved.

Figure 8A:
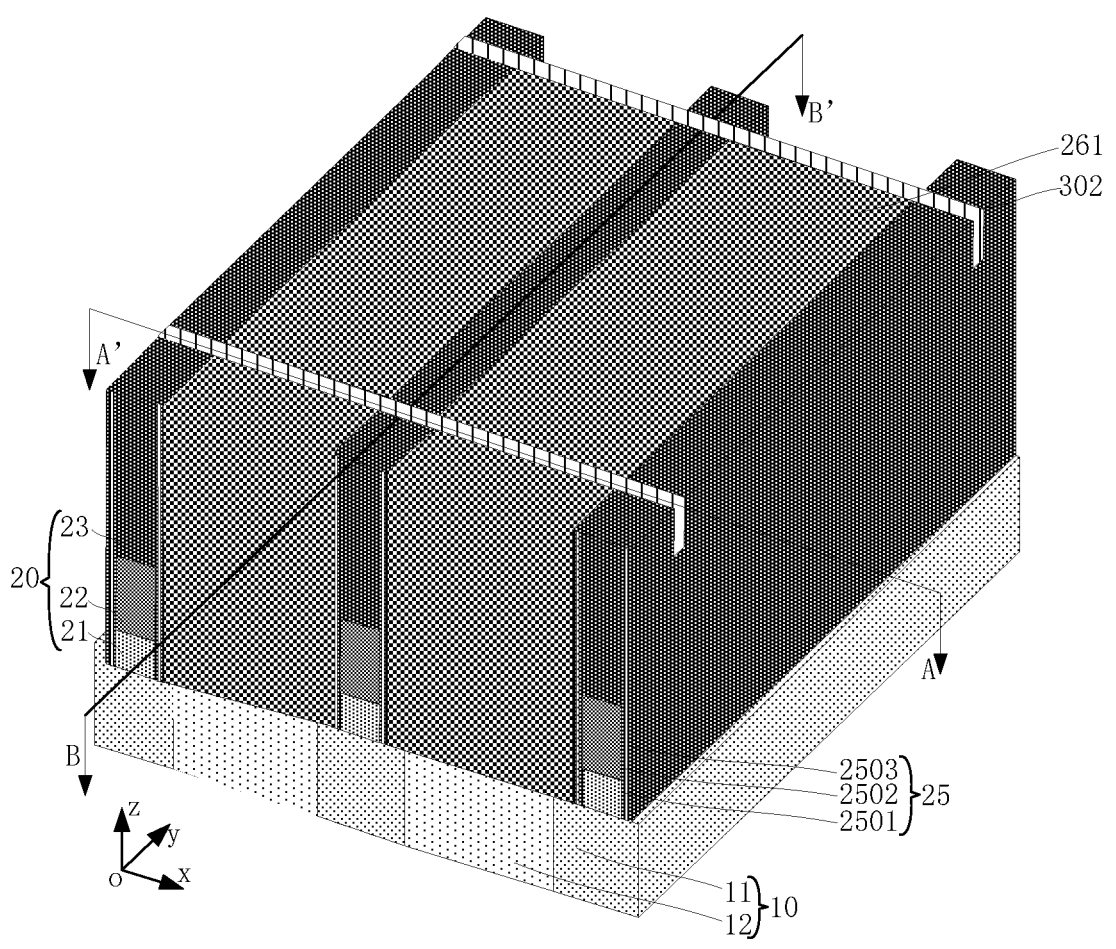
FIG. 8A-FIG. 8C illustrate three-dimensional diagrams and cross-sectional structural diagrams of the structure obtained at S40 of a method for manufacturing a semiconductor structure provided in an embodiment of the present disclosure.
Figure 8B:
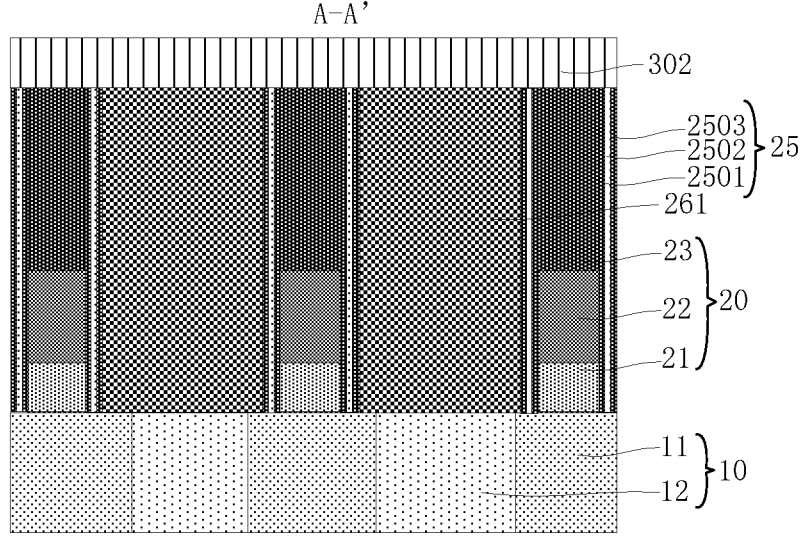
Figure 8C:
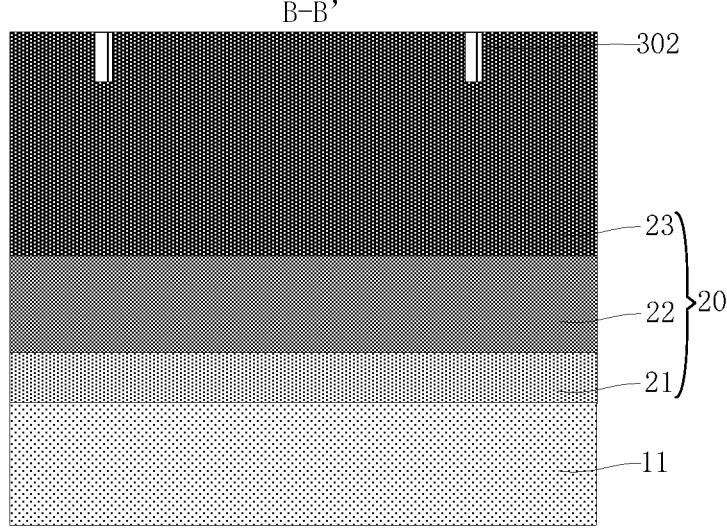
Figure 9A:
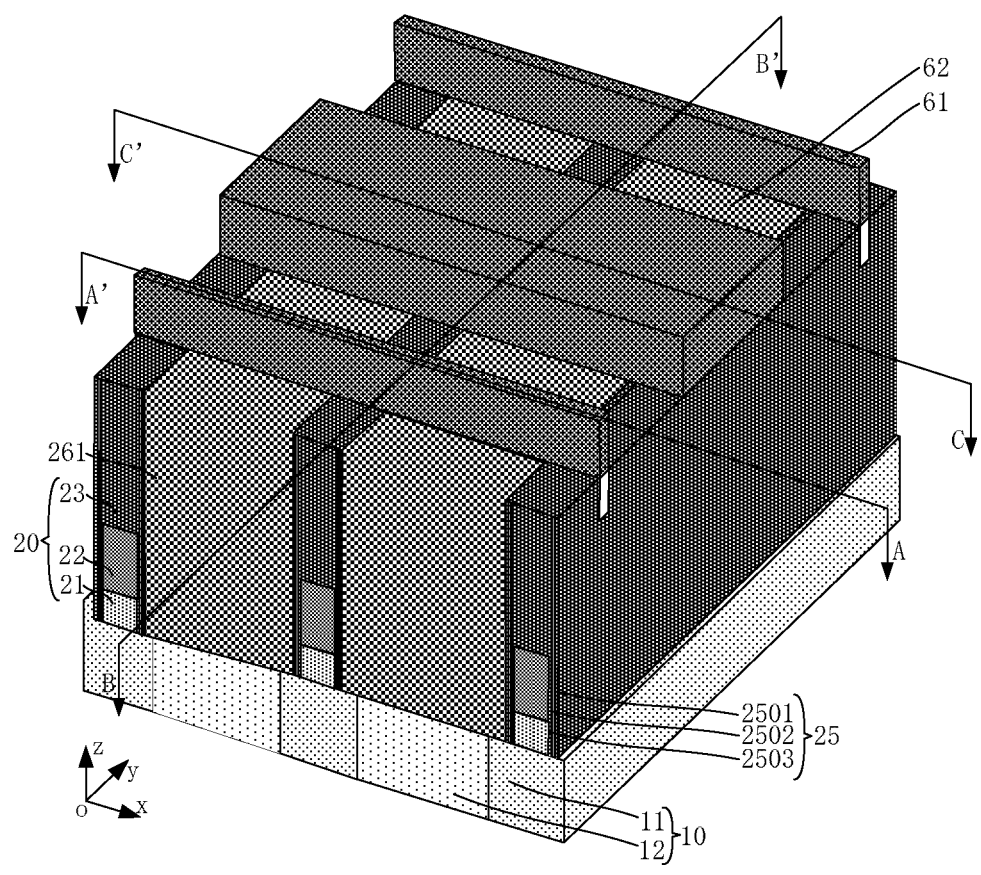
Figure 9B:
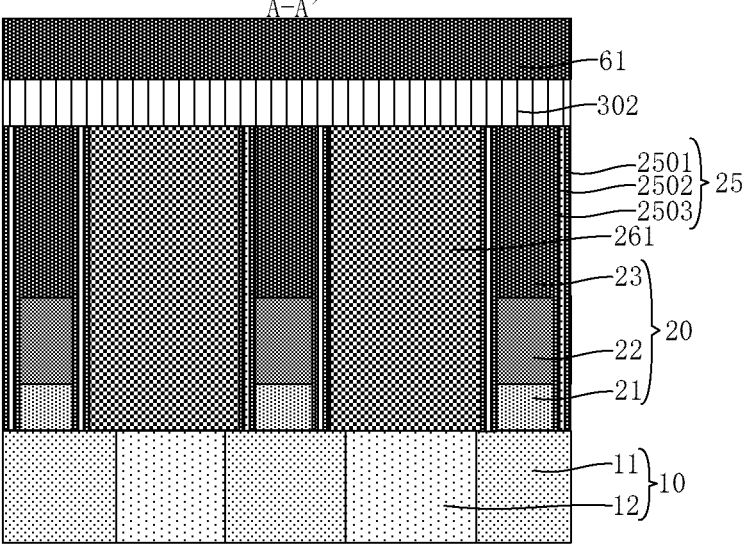
FIG. 9B illustrates a cross-sectional diagram of the three-dimensional diagram structure illustrated in FIG. 9A along the AA' direction.
Figure 9C:
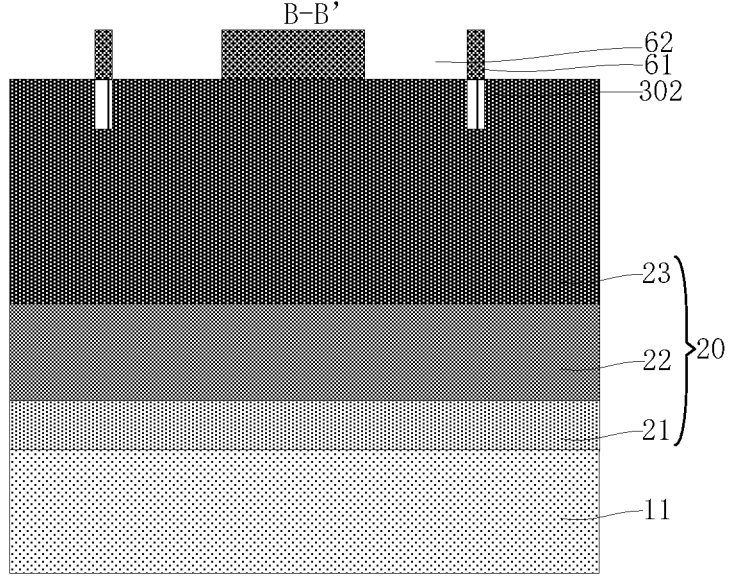
FIG. 9C illustrates a cross-sectional diagram of the three-dimensional diagram structure illustrated in FIG. 9A along the BB' direction.
Figure 9D:
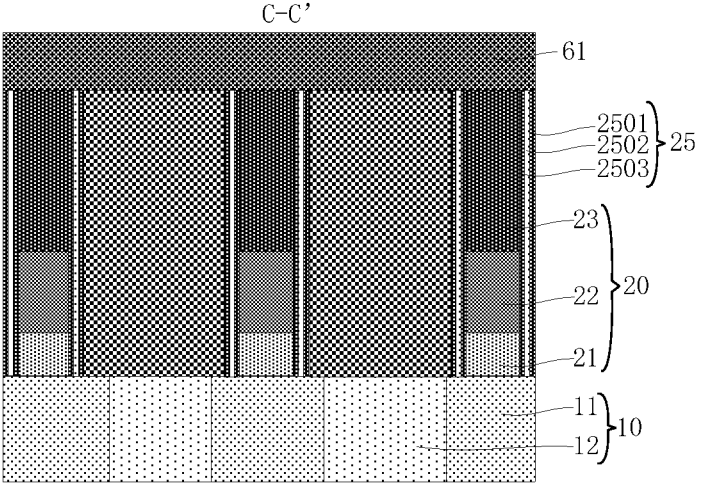
FIG. 9D illustrates a cross-sectional diagram of the three-dimensional diagram structure illustrated in FIG. 9A along the CC' direction.
Figure 10A:
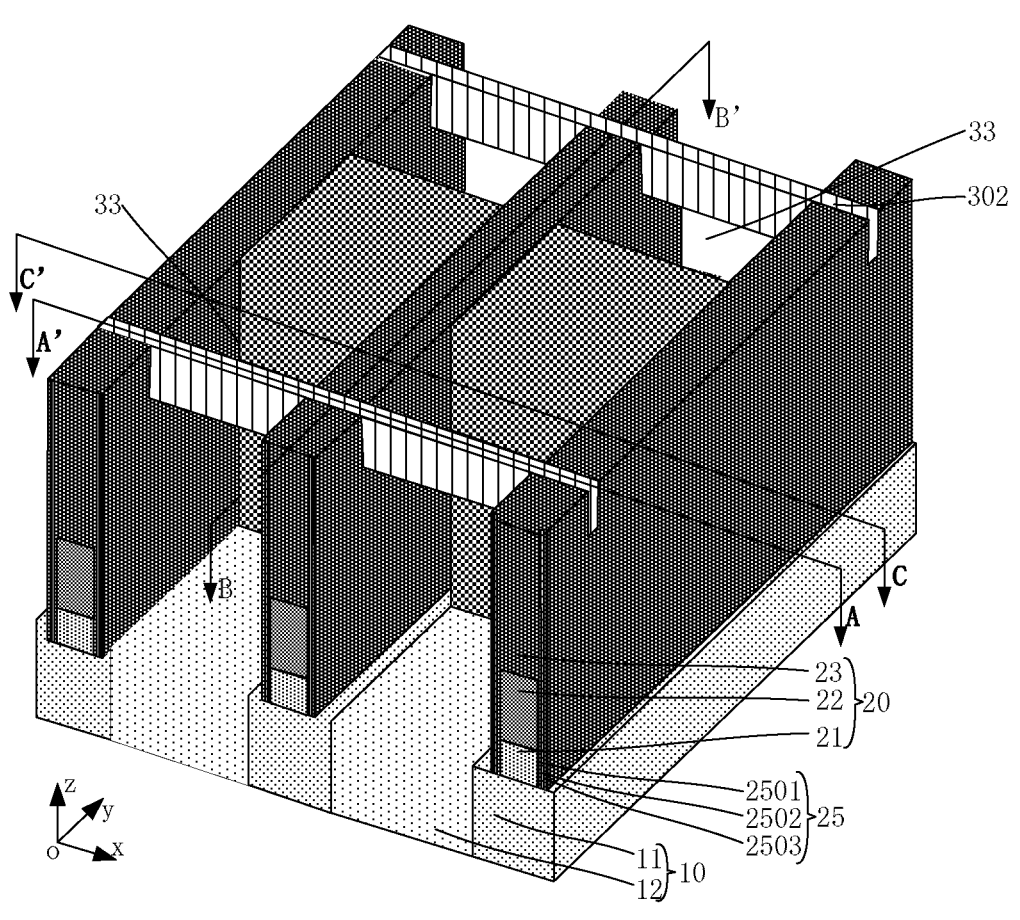
Figure 10B:
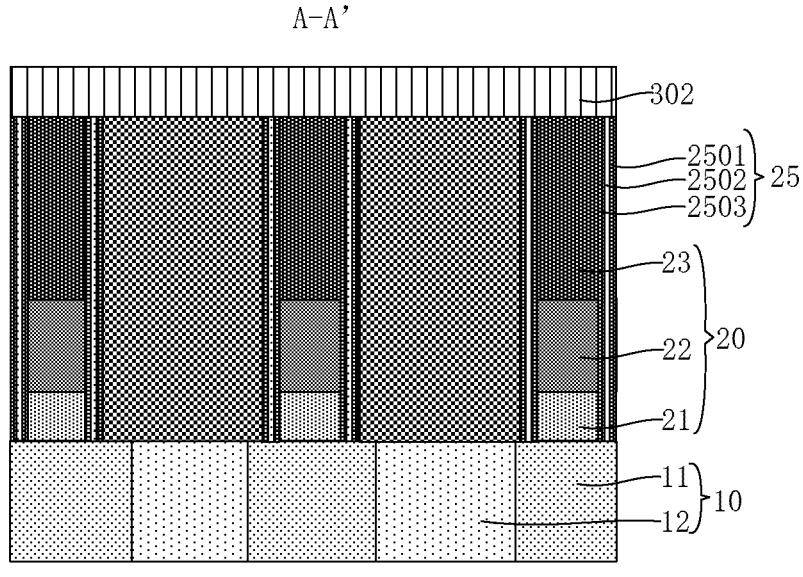
FIG. 10B illustrates a cross-sectional diagram of the three-dimensional diagram structure illustrated in FIG. 10A along the AA' direction.
Figure 10C:
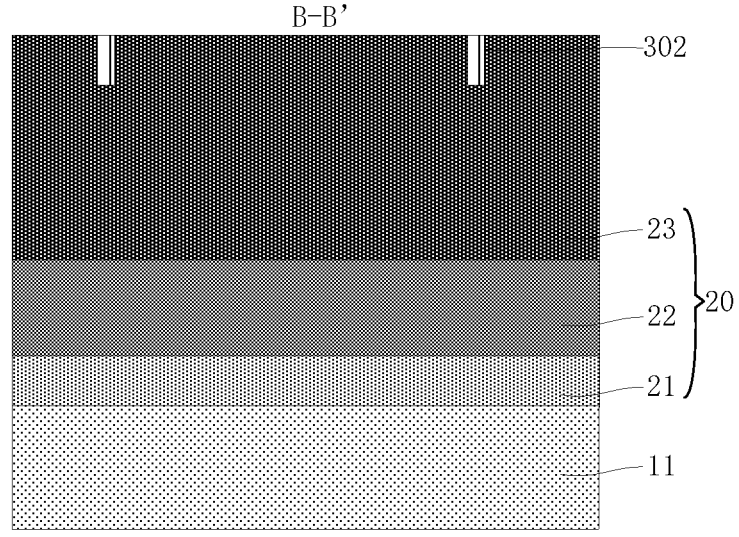
FIG. 10C illustrates a cross-sectional diagram of the three-dimensional diagram structure illustrated in FIG. 10A along the BB' direction.
Figure 10D:
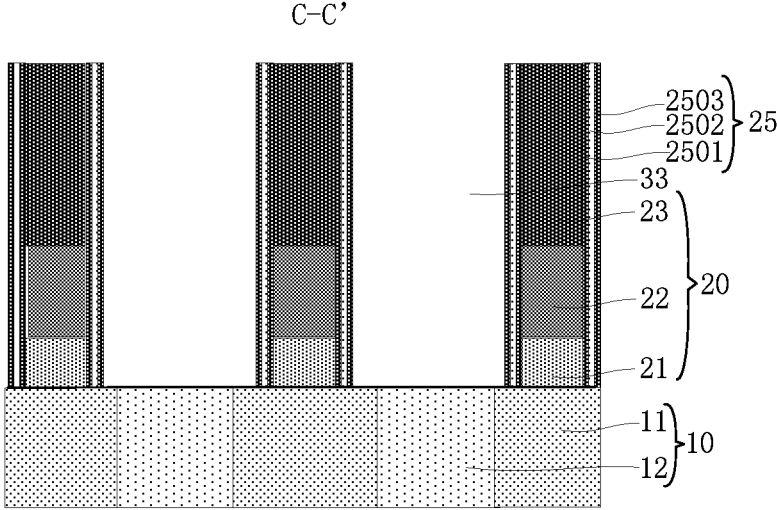
FIG. 10*d* illustrates a cross-sectional diagram of the three-dimensional diagram structure illustrated in FIG. 10A along the CC' direction.
Figure 11A:
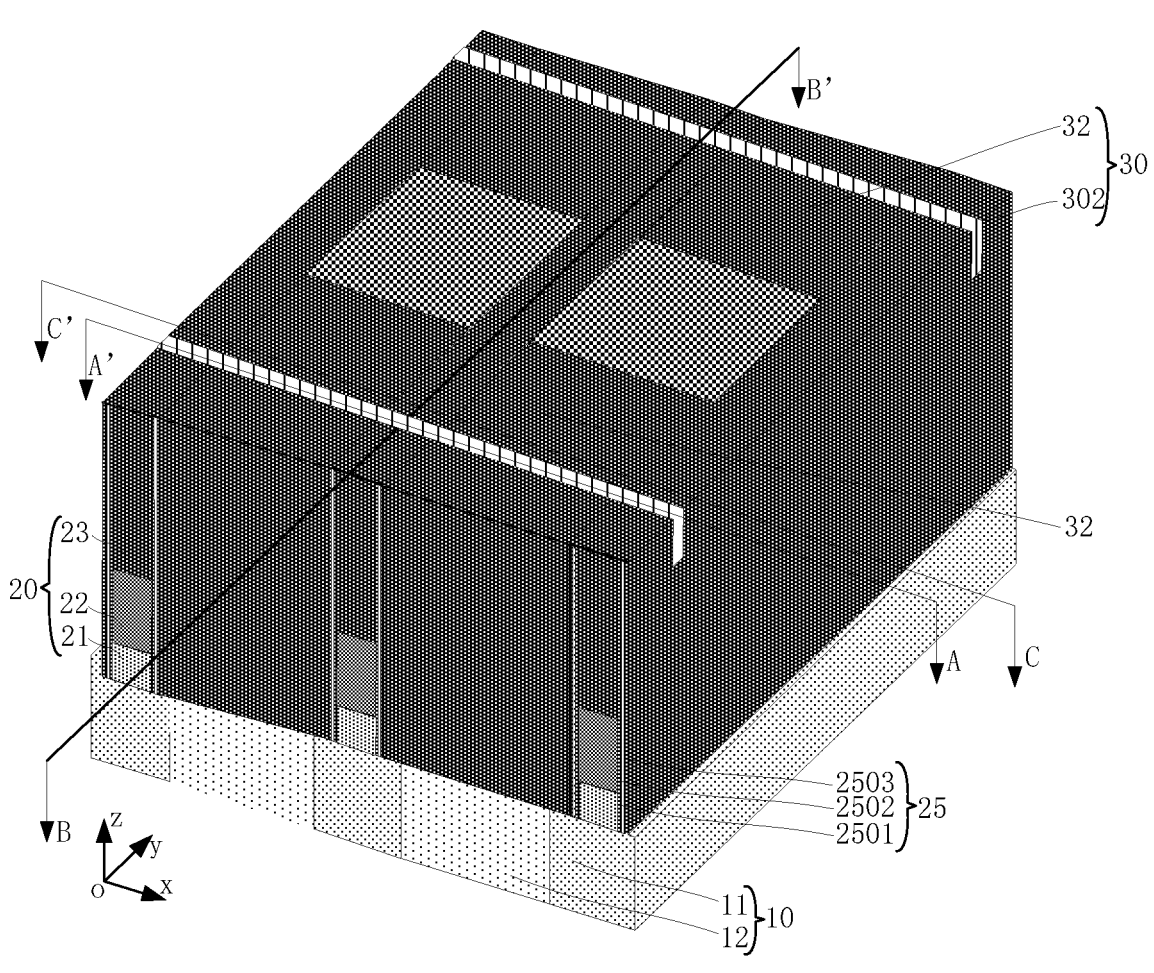
Figure 11B:
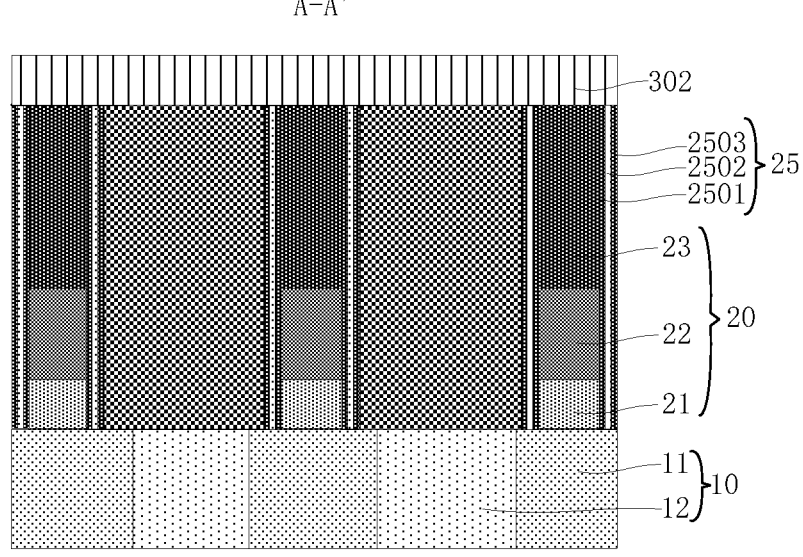
FIG. 11B illustrates a cross-sectional diagram of the three-dimensional diagram structure illustrated in FIG. 11A along the AA' direction.
Figure 11C:
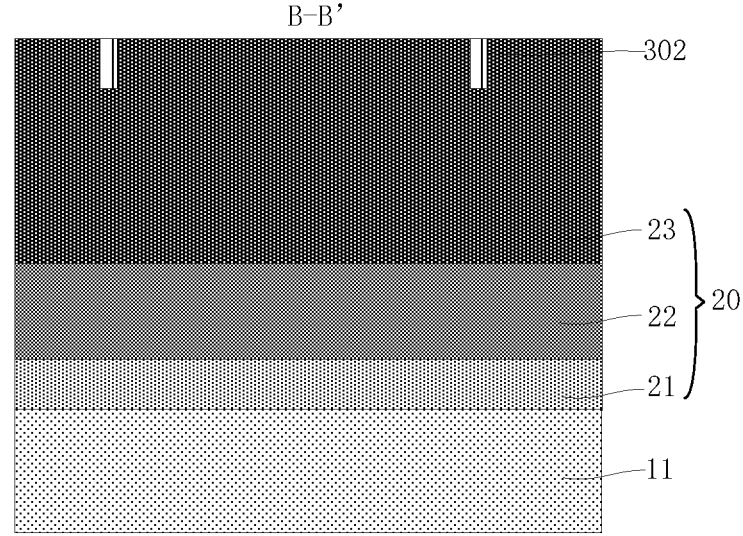
FIG. 11C illustrates a cross-sectional diagram of the three-dimensional diagram structure illustrated in FIG. 11A along the BB' direction.
Figure 11D:
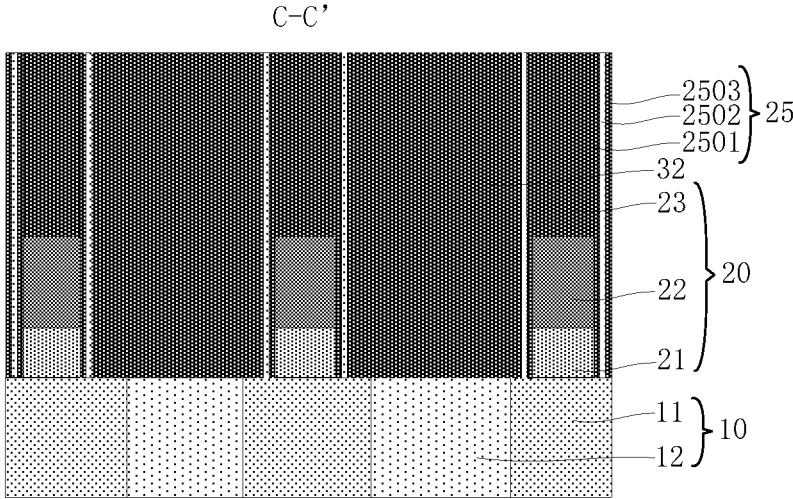
FIG. 11D illustrates a cross-sectional diagram of the three-dimensional diagram structure illustrated in FIG. 11A along the CC' direction.
Figures 12A, 12B:
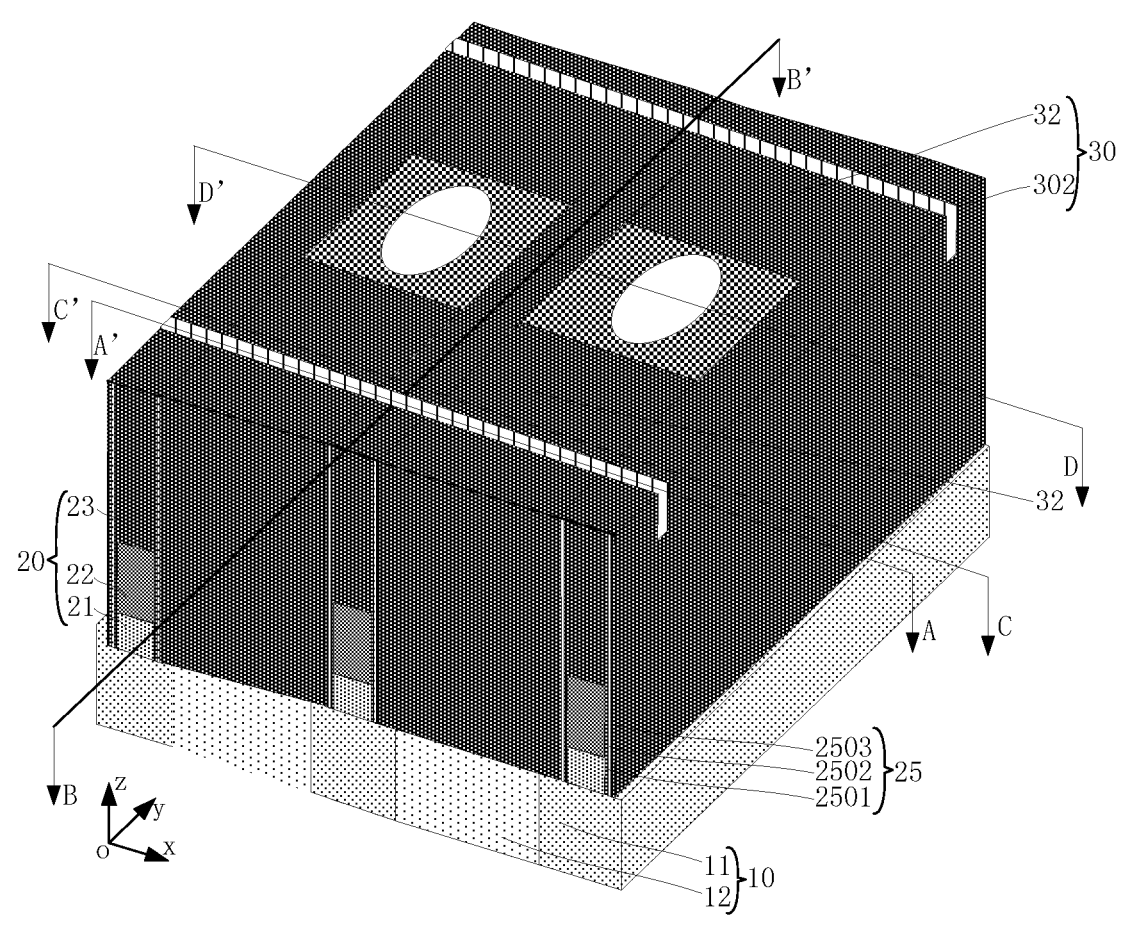
FIG. 12B illustrates a cross-sectional diagram of the three-dimensional diagram structure illustrated in FIG. 12A along the AA' direction.
Figure 12C:
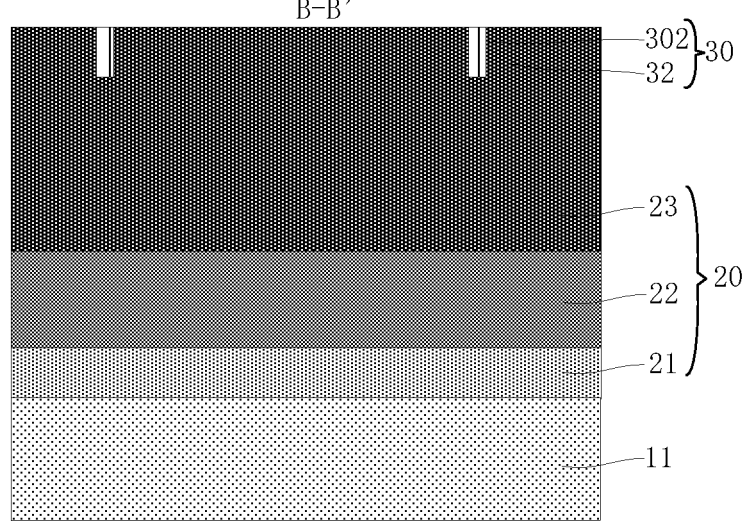
FIG. 12C illustrates a cross-sectional diagram of the three-dimensional diagram structure illustrated in FIG. 12A along the BB' direction.
Figure 12D:
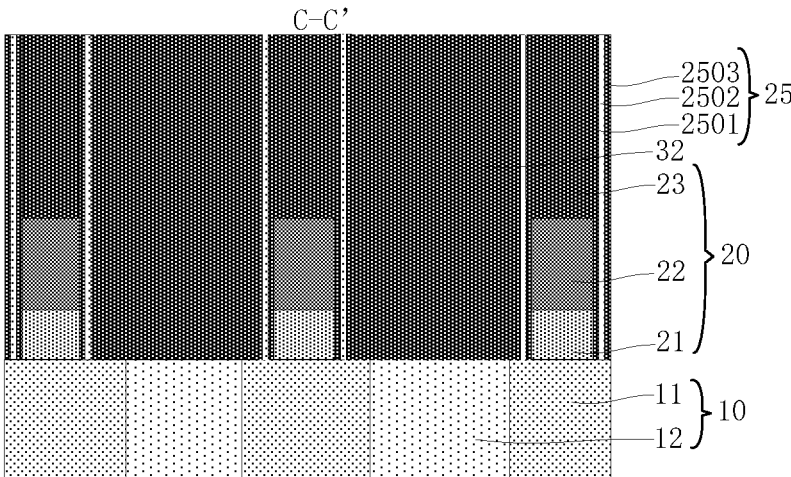
FIG. 12D illustrates a cross-sectional diagram of the three-dimensional diagram structure illustrated in FIG. 12A along the CC' direction.
Figure 12E:
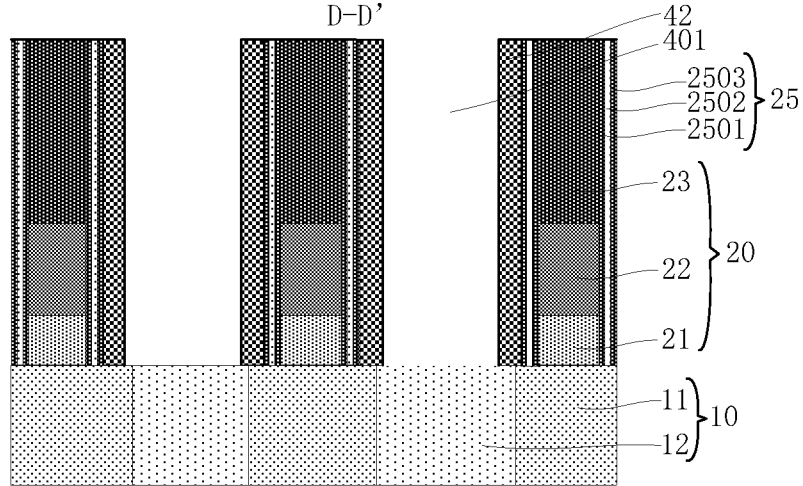
FIG. 12E illustrates a cross-sectional diagram of the three-dimensional diagram structure illustrated in FIG. 12A along the DD' direction.
Figure 13A:
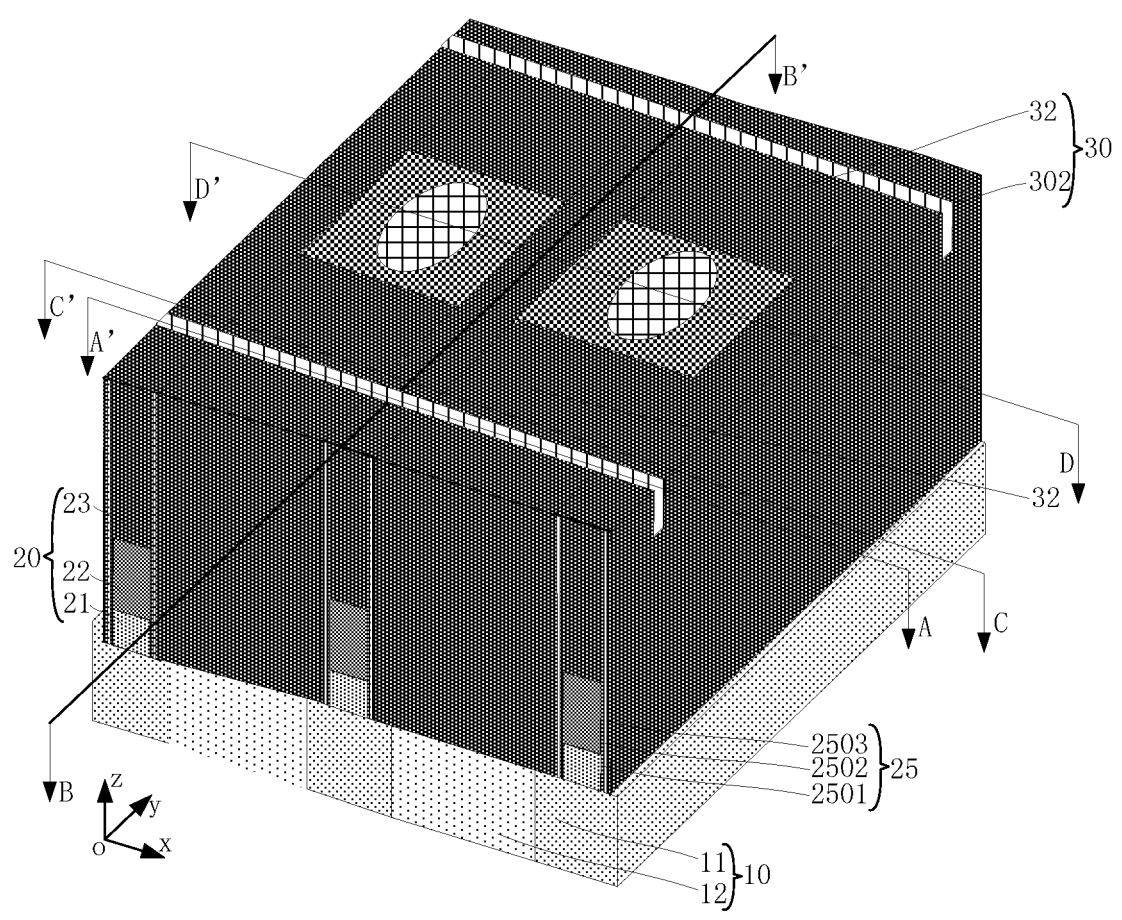
Figure 13B:
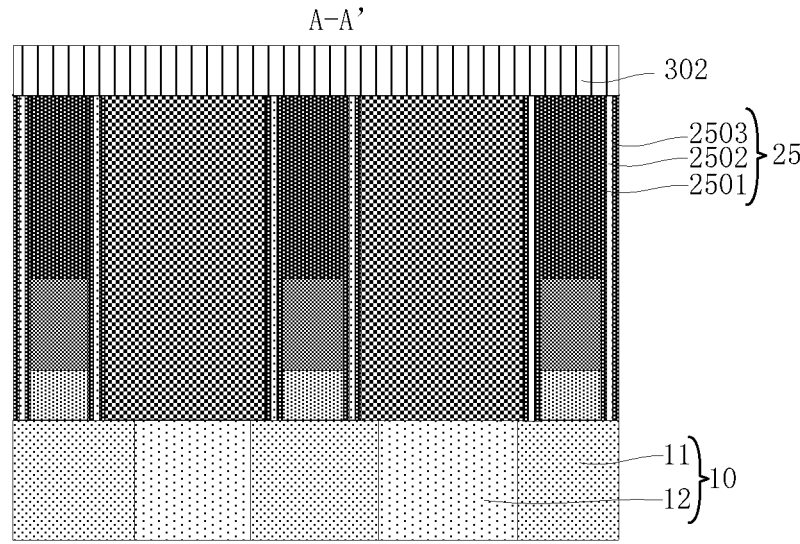
FIG. 13B illustrates a cross-sectional diagram of the three-dimensional diagram structure illustrated in FIG. 13A along the AA' direction.
Figure 13C:
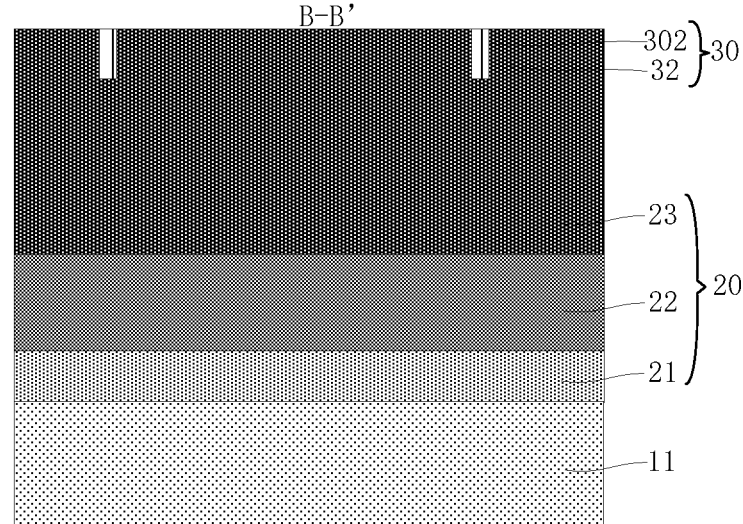
FIG. 13C illustrates a cross-sectional diagram of the three-dimensional diagram structure illustrated in FIG. 13A along the BB' direction.
Figure 13D:
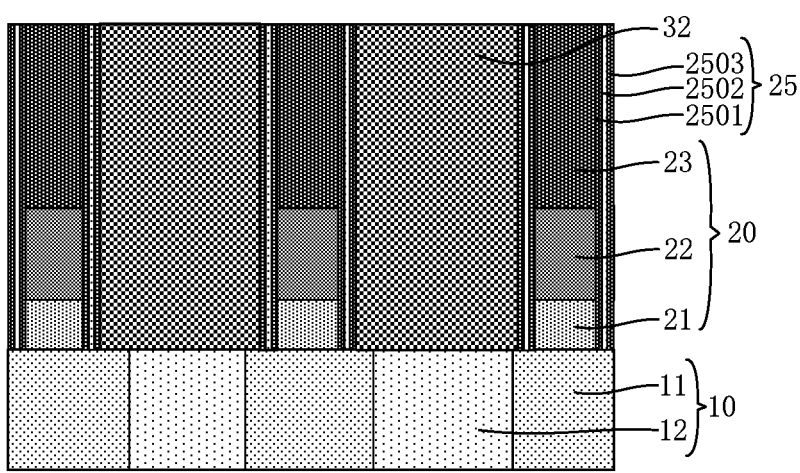
FIG. 13D illustrates a cross-sectional diagram of the three-dimensional diagram structure illustrated in FIG. 13A along the CC' direction.
Figure 13E:
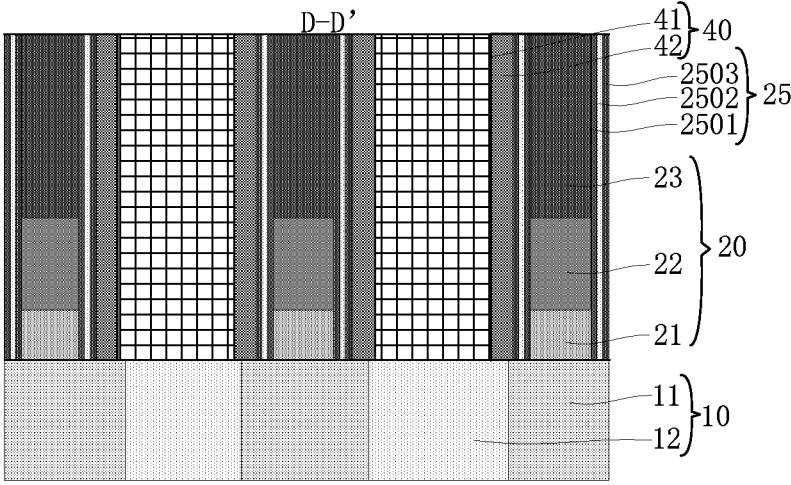

As an example, referring to FIG. 8A-FIG. 8C, after the bit line protective layers 25 are formed on the outer sidewalls of the bit line structure 20, the method further includes that: an initial protective layer 261 is filled in a gap between adjacent bit line structures 20. After that, a dry etching process or a planarization process can be adopted to make the upper surface of the obtained structure flush, so as to avoid the large difference in the intermediate support structure holes or conductive holes manufactured subsequently, the uniformity of the manufactured intermediate support structures and conductive holes is improved, and the performance and reliability of the conductive plug structure manufactured subsequently are improved.

By way of example, please continue to refer to FIG. 8A-FIG. 8C, an initial protective layer 261 may be filled with a filling material in a gap between every two adjacent bit line structures 20 by atomic layer deposition, chemical vapor deposition, spin coating the insulating medium, or the like. The initial protective layer 261 includes but is not limited to a oxide for adiabatic and insulating, for example, the manufacturing material of the initial protective layer 261 includes but is not limited to one or more of a silicon oxide ($SiO_2$) layer, a silicon nitride ($Si_3N_4$) layer, an aluminum oxide ($Al_2O_3$) layer, or a silicon oxynitride (SiON) layer. An air gap may be provided within the initial protective layer 261. For example, at least one air gap may be formed in the initial protective layer 261, and there is air or other gases in the air gap, so that better adiabaticity and insulation effects are formed by using the air gap.

As an example, referring to FIG. 9A-FIG. 11D, after filling the initial protective layer 261 in the gap, the method further includes operations at S52-S56.

At S52, a second patterned photoresist layer 61 is formed on initial protective layers 261, second openings 62 being provided in the second patterned photoresist layer 61, and the second openings 62 being used for defining shape and position of intermediate support structure holes 33.

At S54, part of the initial protective layers 261 adjacent to the initial support pattern structures 302 are etched by using the second patterned photoresist layer 61 as a mask, to form the intermediate support structure holes 33, a bottom of each of the intermediate support structure holes 33 exposing an upper surface of the substrate 10.

At S56, third dielectric material layers are filled in the intermediate support structure holes 33 to form the intermediate support structures 32, a bottom surface of each of the intermediate support structures 32 contacting the upper surface of the substrate 10.

As an example, please continue to refer to FIG. 9A-FIG. 11D, a first mask layer (not illustrated) may be formed on the upper surface of the obtained structure at S52. Then, a photoresist layer (not illustrated) is coated on the first mask layer, and a second patterned photoresist layer 61 is formed on the initial protective layers 261 through a series of steps such as exposure and development. The second patterned photoresist layer 61 has second openings 62, and the second openings 62 are used to define the shape and position of the intermediate support structure holes 33. The second patterned photoresist layer 61 includes, but is not limited to, an N-photoresist layer.

For example, the first mask layer includes but is not limited to a hard mask layer. The hard mask layer is, for example, a spin-on hardmasks (SOH) layer. The SOH layer may be an insulating layer of a hydrocarbon ($C_xH_y$) system, which may include a silicon hard mask material, a carbon hard mask material, an organic hard mask material, and the like. The SOH is an auxiliary material for forming semiconductor micro-patterns, which has the characteristics of filling gaps, increasing flatness and enhancing corrosion resistance. Using this material to form a hard mask layer can make the subsequent etching effect better.

For example, a material forming the second dielectric material layer, a material forming the third dielectric material layers and a material forming the first dielectric material layer are all the same, such as silicon nitride, to reduce the manufacturing cost of the device.

As an example, please continue to refer to FIG. 9A-FIG. 11D, at S54, part of the initial protective layers 261 adjacent to the initial support pattern structures 302 are removed by a dry etching process and by using the second patterned photoresist layer 61 as a mask, to form the intermediate support structure holes 33, a bottom of each of the intermediate support structure holes 33 exposing an upper surface of the substrate 10. The dry etching includes at least any one of reactive ion etching (RIE), inductively coupled plasma (ICP) etching or high density plasma (HDP) etching.

As an example, please continue to refer to FIG. 9A-FIG. 11D, at S56, third dielectric material layers are filled in the intermediate support structure holes 33 by using at least one of PVD, CVD, ALD and the like to form the intermediate support structures 32, a bottom surface of each of the intermediate support structures 32 contacting the upper surface of the substrate 10.

As an example, please continue to refer to FIG. 9A-FIG. 11D, at S54, the manufacturing material for forming the initial protective layer 261 may include but is not limited to silicon dioxide. The manufacturing material forming the intermediate support structures 32 may include but is not limited to silicon nitride, the manufacturing material of the intermediate support structures 32 may be provided to be the same as or different from the manufacturing material of the initial support pattern structures 302. For example, at S56, the manufacturing material of the intermediate support structures 32 may be provided to be the same as that of the manufacturing material of the initial support pattern structures 302, both of which are silicon nitride, so that the intermediate support structures 32 and the initial support pattern structures 302 together constitute the target support structures 30, which improves the strength and reliability of the target support structures 30, thereby improving the depth-to-width ratio of the manufactured bit line structures and the capacitance contact structures, and improving the electrical performance parameters and signal transmission quality of the manufactured bit line.

As an example, referring to FIG. 12A-FIG. 13E, after forming the intermediate support structures 32, the method further includes operations at S62-S66.

At S62, a third patterned photoresist layer is formed on the obtained structure (not illustrated), third openings being provided in the third patterned photoresist layer (not illustrated), and the third openings are used for defining shape and position of the conductive holes 401.

At S64, the part of the initial protective layers 261 are etched by using the third patterned photoresist layer as a mask to form a plurality of conductive holes 401, a bottom of each of the conductive holes 401 exposing the upper surface of the substrate 10.

At S66, the conductive plug structure 41 is formed in each of the conductive holes 401, a bottom surface of each of the conductive plug structures 41 contacting the upper surface of the substrate 10.

As an example, please continue to refer to FIG. 12A-FIG. 13E, at S62, a second mask layer (not illustrated) may be formed on the obtained structure, after coating a photoresist layer (not illustrated) on the upper surface of the second mask layer, a third patterned photoresist layer (not illustrated) is formed through a series of steps such as exposure, development, etc. Third openings are provided in the third patterned photoresist layer (not illustrated), and the third openings are used for defining the shape and position of the conductive holes 401. The third patterned photoresist layer includes, but is not limited to, an N-photoresist layer.

As an example, please continue to refer to FIG. 12A-FIG. 13E, the second mask layer includes but is not limited to a hard mask layer. The hard mask layer is, for example, a spin-on hardmasks (SOH) layer. The SOH layer may be an insulating layer of a hydrocarbon ($C_xH_y$) system, which may include a silicon hard mask material, a carbon hard mask material, an organic hard mask material, and the like. The SOH is an auxiliary material for forming semiconductor micro-patterns, which has the characteristics of filling gaps, increasing flatness and enhancing corrosion resistance.

Using this material to form a hard mask layer can make the subsequent etching effect better.

As an example, please continue to refer to S64 and FIG. 12A-FIG. 13E, the part of the initial protective layers 261 are removed by a dry etching process and by using the third patterned photoresist layer as a mask to form a plurality of conductive holes 401, a bottom of each of the conductive holes 401 exposing the upper surface of the substrate 10, and the conductive holes 401 are in a cylinder shape or elliptical cylinder shape to reduce the resistance and parasitic capacitance of the conductive plug structure manufactured subsequently.

As an example, please continue to refer to S66 and FIG. 12A-FIG. 13E, at least one of PVD, CVD, ALD and the like can be used to form the conductive plug structure 41 in each of the conductive holes 401, and the bottom surface of the conductive plug structure 41 contacts the upper surface of the substrate 10.

As an example, please continue to refer to FIG. 12A-FIG. 13E, the conductive plug structure 41 is in a cylinder shape or elliptical cylinder shape to reduce the resistance and parasitic capacitance of the conductive plug structure 41.

As an example, please continue to refer to FIG. 12A-FIG. 13E, the manufacturing material of the conductive plug structure 41 includes but is not limited to amorphous silicon, and the conductive plug structure may serve as a conductive contact structure between a capacitor and a bit line manufactured subsequently. In the embodiment, because the parasitic capacitance of the conductive contact structure is reduced, and the delay caused by the parasitic capacitance of the conductive contact structure is reduced, thereby improving the performance and reliability of the semiconductor memory device manufactured by using the structure obtained in the embodiment.

As an example, a width of an initial support pattern structure 302 ranges from one half of a width of a bit line structure 20 to the width of the bit line structure 20. For example, the width of the initial support pattern structure 302 may be 0.5, 0.75, 0.9, or 1 times of the width of the bit line structure 20 or the like. The width of the initial support pattern structure 302 is narrower, which ensures that the first dielectric material layer 231, the second conductive material layer 221, the barrier material layer 211, and the first conductive material layer which are below the initial support pattern structures 302 can be easily removed by adjusting the parameters of the etching process.

As an example, please continue to refer to FIG. 12A-FIG. 13E, at S64, the part of the initial protective layers 261 are removed by a dry etching process and by using the third patterned photoresist layer as a mask to expose the upper surface of the substrate 10 and form the conductive holes 401, which facilitates subsequent formation of the conductive plug structures 41 in the conductive holes 401. The material for manufacturing the target protective layer 42 includes but is not limited to silicon dioxide, and since the outer surface of the conductive plug structure 41 is covered with the target protective layer 42, parasitic capacitance between the bit line structures 20 and the capacitance contact structure can be effectively reduced.

By way of example, please continue to refer to FIG. 12A-FIG. 13E, at S66, at least one process can be used but not limited to physical vapor deposition (PVD), chemical vapor deposition (CVD), atomic layer deposition (ALD), or the like may be employed, but not limited to form the conductive plug structure 41 in each of the conductive holes 401, the bottom surface of the conductive plug structure 41 contacting the upper surface of the substrate 10. Since the depth-to-width ratio of the conductive plug structure 41 is improved by the target support structures 30, and the electrical performance parameters and signal transmission quality of the manufactured bit line are improved, the situation that the target conductive contact structure 40 cannot be activated can be effectively avoided. Since the outer surface of the conductive plug structure 41 is covered with the target protective layer 42, parasitic capacitance between the bit line structures 20 and the capacitance contact structure can be effectively reduced. As an example, the width of the bit line is 5 nm-10 nm. For example, the width of the bit line may be 5 nm, 7 nm, 9 nm, 10 nm, etc.

For example, a material forming the second dielectric material layer, a material forming the third dielectric material layers and a material forming the first dielectric material layer are all the same, such as silicon nitride, to reduce the manufacturing cost of the device.

As an example, please continue to refer to FIG. 13A-FIG. 13E, in some embodiments of the present disclosure, there is provided a semiconductor structure, which is manufactured by a method for manufacturing a semiconductor structure described in any of the disclosed embodiments. The semiconductor structure includes a substrate 10, bit line structures 20 distributed at intervals, initial support pattern structures 302 distributed at intervals and target conductive contact structures 40. The bit line structures 20 distributed at intervals are located on the substrate 10, the bit line structures 20 extending along a first direction (e.g. the oy direction). Each of the initial support pattern structures 302 runs through top regions of the bit line structures 20, the initial support pattern structures 302 extending along a second direction (e.g. the ox direction), and the first direction intersecting with the second direction. Each of the target conductive contact structures 40 is located within adjacent bit line structures 20 and adjacent initial support pattern structures 302, each of the target conductive contact structures 40 including a conductive plug structure 41 and a target protective layer 42 covering an outer sidewall of the conductive plug structure. In the embodiment, the parasitic capacitance of the conductive contact structure is reduced, and the delay caused by the parasitic capacitance of the conductive contact structure is reduced, thereby improving the performance and reliability of the semiconductor memory device manufactured by using the structure obtained in the embodiment.

As an example, please continue to refer to FIG. 13A-FIG. 13E, each of the intermediate support structures 32 is located between adjacent target conductive contact structures 40 and adjacent to the initial support pattern structure 302, bottom surfaces of the intermediate support structures 32 contact an upper surface of the substrate 10, and the intermediate support structures 32 and initial support pattern structures 302 adjacent to the intermediate support structures together constitute target support structures 30, which improves the strength and reliability of the target support structure 30, thereby improving the depth-to-width ratio of the manufactured bit line structure 20 and the capacitance contact structure, and improving the electrical performance parameters and signal transmission quality of the manufactured bit line.

As an example, please continue to refer to FIG. 13A-FIG. 13E, the target protective layer 42 fills a gap between the conductive plug structure 41 and the bit line structures 20 and/or a gap between the conductive plug structure 41 and the target support structures 30. Thus, the parasitic capacitance of the conductive contact structure is reduced, and the delay caused by the parasitic capacitance of the conductive contact structure is reduced, thereby improving the performance and reliability of the semiconductor memory device manufactured by using the structure obtained in the embodiment.

As an example, please continue to refer to FIG. 13A-FIG. 13E, a width of an initial support pattern structure 302 ranges from one half of a width of a bit line structure to the width of the bit line structure. For example, the width of the initial support pattern structure 302 may be 0.5, 0.75, 0.9, or 1 times of the width of the bit line structure 20 or the like. The width of the initial support pattern structure 302 is narrower, which ensures that the first dielectric material layer, the second conductive material layer, the barrier material layer, and the first conductive material layer which are below the initial support pattern structures 302 can be easily removed by adjusting the parameters of the etching process.

By way of example, please continue to refer to FIG. 13A-FIG. 13E, the conductive plug structure 41 is in a cylinder shape or elliptical cylinder shape to reduce the resistance and parasitic capacitance of the conductive plug structure 41.

To sum up, in the embodiments of the present disclosure, there is provided a semiconductor structure and a manufacturing method thereof, before manufacturing the bit line structures distributed at intervals, initial support pattern structures for running through the bit line structures are formed at the top region of the obtained structure, so as to provide a support force for the bit line structures, improve the structural strength of the bit line structures, and avoid distortion, tilt or collapse of the bit line structures in the formation process. Due to the existence of the support of the initial support pattern structures, the depth-to-width ratio of the manufactured bit line structures and the capacitance contact structures can be further improved, the electrical performance parameters and the signal transmission quality of the manufactured bit line can be improved, and the situation that the target conductive contact structures cannot be activated can be effectively avoided. Because there is a target protective layer between the manufactured conductive plug structure for capacitance contact and the bit line structures, the parasitic capacitance between the bit line structures and the capacitance contact structure can be effectively reduced.

Please note that the above embodiments are for illustrative purposes only and are not intended to limit the present disclosure.

It should be understood that, unless expressly stated herein, the operations are performed without strict order restrictions and the operations may be performed in other orders. Further, at least a portion of the operations may include a plurality of sub-operations or a plurality of stages, these sub-operations or stages are not necessarily executed at the same time, but may be executed at different times, and the execution sequence of these sub-operations or stages is not necessarily sequential, but may be executed in turn or alternately with other operations or at least a part of sub-operations or stages of other operations.

Each embodiment in the description is described in a progressive manner and each embodiment focuses on the differences from other embodiments. The same and similar parts between the embodiments can be referred to each other.

The technical features of the above-described embodiments may be arbitrarily combined, and all possible combinations of the technical features of the above-described embodiments have not been described in order to make the description concise. However, as long as there is no contradiction in the combinations of these technical features, they should be considered as the scope described in this description.

The above-described embodiments are intended to express only a few implementation rights of the present disclosure, and the description thereof is more specific and detailed, but should not therefore be construed as limiting the scope of the patent application. It should be noted that for those of ordinary skill in the art, there are several variations and improvements that can be made without deviating from the ideas of this disclosure, which fall within the scope of protection of this disclosure. Therefore, the scope of protection of this disclosure shall be subject to the appended claims.

The invention claimed is:

1. A method for manufacturing a semiconductor structure, comprising:

providing a substrate, forming bit line structures extending along a first direction on the substrate, and forming initial support pattern structures extending along a second direction on the substrate, wherein each of the initial support pattern structures runs through top regions of the bit line structures, and the first direction intersects with the second direction;

filling an initial protective layer in a gap between adjacent bit line structures; and removing part of the initial protective layer to form a conductive hole, wherein the conductive hole is located between adjacent initial support pattern structures, and forming a conductive plug structure in the conductive hole;

wherein operations of forming the bit line structures and forming the initial support pattern structures comprise:

stacking a first conductive material layer, a barrier material layer, a second conductive material layer and a first dielectric material layer sequentially on the substrate;

forming the initial support pattern structures on the first dielectric material layer, wherein a first groove is provided between adjacent initial support pattern structures;

forming second dielectric layers, wherein each of the second dielectric layers fills at least the first groove; and removing part of the second dielectric layers, part of the first dielectric material layer, part of the second conductive material layer, part of the barrier material layer and part of the first conductive material layer to form the bit line structures, wherein initial support pattern structures located between adjacent bit line structures are suspended in midair; and wherein an operation of forming the initial support pattern structures comprises:

forming an initial support material layer on the first dielectric material layer, wherein the initial support material layer covers an upper surface of the first dielectric material layer; and taking the first dielectric material layer as an etching stop layer, and etching part of the initial support material layer by a dry etching process to form the initial support pattern structures.

2. The method for manufacturing the semiconductor structure of claim 1, wherein before an operation of forming the conductive hole, the method further comprises:

removing part of the initial protective layer adjacent to the initial support pattern structures, to form intermediate support structure holes extending along the second direction and distributed at intervals; and forming intermediate support structures in the intermediate support structure holes, wherein the intermediate support structures and initial support pattern structures adjacent to the intermediate support structures together constitute target support structures, and bottom surfaces of the target support structures contact an upper surface of the substrate.

3. The method for manufacturing the semiconductor structure of claim 2, wherein the initial protective layer fills at least one of: a gap between the conductive plug structure and bit line structures, or a gap between the conductive plug structure and target support structures.

4. The method for manufacturing the semiconductor structure of claim 1, wherein an etching selectivity ratio of the initial support material layer to the first dielectric material layer is greater than 10:1 under a same condition.

5. The method for manufacturing the semiconductor structure of claim 1, wherein a width of an initial support pattern structure ranges from one half of a width of a bit line structure to the width of the bit line structure.

6. The method for manufacturing the semiconductor structure of claim 1, wherein a material forming the initial support material layer comprises silicon carbide nitride; and a material forming the first dielectric material layer comprises silicon nitride.

7. A method for manufacturing a semiconductor structure, comprising:

providing a substrate, forming bit line structures extending along a first direction on the substrate, and forming initial support pattern structures extending along a second direction on the substrate, wherein each of the initial support pattern structures runs through top regions of the bit line structures, and the first direction intersects with the second direction;

filling an initial protective layer in a gap between adjacent bit line structures; and removing part of the initial protective layer to form a conductive hole, wherein the conductive hole is located between adjacent initial support pattern structures, and forming a conductive plug structure in the conductive hole;

wherein operations of forming the bit line structures and forming the initial support pattern structures comprise:

stacking a first conductive material layer, a barrier material layer, a second conductive material layer and a first dielectric material layer sequentially on the substrate;

forming the initial support pattern structures on the first dielectric material layer, wherein a first groove is provided between adjacent initial support pattern structures;

forming second dielectric layers, wherein each of the second dielectric layers fills at least the first groove; and removing part of the second dielectric layers, part of the first dielectric material layer, part of the second conductive material layer, part of the barrier material layer and part of the first conductive material layer to form the bit line structures, wherein initial support pattern structures located between adjacent bit line structures are suspended in midair; and wherein an operation of forming the second dielectric layers comprises:

forming a second dielectric material layer, wherein the second dielectric material layer covers an upper surface of each of the initial support pattern structures and fills each first groove; and taking each of the initial support pattern structures as a stop layer, removing part of the second dielectric material layer by a dry etching process or a planarization process, wherein remaining second dielectric material layer constitutes the second dielectric layers.

8. The method for manufacturing the semiconductor structure of claim 7, wherein an operation of forming the bit line structures further comprises:

forming a first patterned photoresist layer on upper surfaces of the second dielectric layers, wherein first openings are provided in the first patterned photoresist layer, and the first openings are used for defining the bit line structures; and etching the part of the second dielectric layers, the part of the first dielectric material layer, the part of the second conductive material layer, the part of the barrier material layer and the part of the first conductive material layer by using the first patterned photoresist layer as a mask, to form the bit line structures and the gaps between the adjacent bit line structures, such that initial support pattern structures located between the adjacent bit line structures are suspended in midair.

9. The method for manufacturing the semiconductor structure of claim 8, wherein after filling the initial protective layer in the gap, the method further comprises:

forming a second patterned photoresist layer on initial protective layers, wherein second openings are provided in the second patterned photoresist layer, and the second openings are used for defining intermediate support structure holes;

etching part of the initial protective layers adjacent to the initial support pattern structures by using the second patterned photoresist layer as a mask, to form the intermediate support structure holes, wherein bottoms of the intermediate support structure holes expose an upper surface of the substrate; and filling third dielectric material layers in the intermediate support structure holes to form intermediate support structures, wherein bottom surfaces of the intermediate support structures contact the upper surface of the substrate.

10. The method for manufacturing the semiconductor structure of claim 9, wherein after forming the intermediate support structures, the method further comprises:

forming a third patterned photoresist layer on the obtained structure, wherein third openings are provided in the third patterned photoresist layer, and the third openings are used for defining the conductive holes;

etching the part of the initial protective layers by using the third patterned photoresist layer as a mask to form a plurality of conductive holes, wherein bottoms of the conductive holes expose the upper surface of the substrate; and forming the conductive plug structure in each of the conductive holes, wherein bottom surfaces of conductive plug structures contact the upper surface of the substrate.

11. The method for manufacturing the semiconductor structure of claim 9, wherein a material forming the second dielectric material layer, a material forming the third dielectric material layers and a material forming the first dielectric material layer are all same.

* * * * *